(12) United States Patent
Morgan

(10) Patent No.: US 8,152,339 B2
(45) Date of Patent: *Apr. 10, 2012

(54) ILLUMINATION DEVICE

(75) Inventor: John Paul Morgan, Toronto (CA)

(73) Assignee: Morgan Solar Inc., Toronto (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/597,648

(22) PCT Filed: May 1, 2008

(86) PCT No.: PCT/CA2008/000847
§ 371 (c)(1),
(2), (4) Date: Apr. 12, 2010

(87) PCT Pub. No.: WO2008/131566
PCT Pub. Date: Nov. 6, 2008

(65) Prior Publication Data
US 2010/0202142 A1      Aug. 12, 2010

Related U.S. Application Data

(60) Provisional application No. 60/915,207, filed on May 1, 2007, provisional application No. 60/942,745, filed on Jun. 8, 2007, provisional application No. 60/951,775, filed on Jul. 25, 2007.

(51) Int. Cl.
*F21V 5/00* (2006.01)
*F21V 7/04* (2006.01)
(52) U.S. Cl. .......... 362/336; 362/607; 362/616
(58) Field of Classification Search .......... 362/336, 362/606, 616, 617
See application file for complete search history.

(56) References Cited

U.S. PATENT DOCUMENTS

| | | |
|---|---|---|
| 4,037,096 A | 7/1977 | Brendgord et al. |
| 4,074,704 A | 2/1978 | Gellert |
| 4,151,582 A | 4/1979 | Grunberger |
| 4,199,376 A | 4/1980 | Sill |
| 4,252,416 A | 2/1981 | Jaccard |
| 4,257,401 A | 3/1981 | Daniels |
| 4,282,862 A | 8/1981 | Soleau |
| 4,344,417 A | 8/1982 | Malecek |

(Continued)

FOREIGN PATENT DOCUMENTS

DE   19937448 A1   2/2001

(Continued)

OTHER PUBLICATIONS

International Search Report of PCT/CA2008/000847; Aug. 13, 2008; Malgorzata Samborski.

(Continued)

*Primary Examiner* — Jong-Suk (James) Lee
*Assistant Examiner* — David J Makiya
(74) *Attorney, Agent, or Firm* — Osler, Hoskin & Harcourt LLP

(57) ABSTRACT

An illumination device having an optical waveguide stage to which is optically coupled a light-projecting stage. The illumination device accepts light from a small isotropic light source such as a light emitting diode or a bulb coupled to the optical waveguide stage. The illumination device spreads the light over a wide area while also collimating it to form a beam. The light-projecting stage and the optical waveguide stage are made of thin slabs of optically transmissive material.

20 Claims, 22 Drawing Sheets

U.S. PATENT DOCUMENTS

| | | | |
|---|---|---|---|
| 4,379,613 A | 4/1983 | Coburn | |
| 4,389,698 A | 6/1983 | Cibie | |
| 4,411,490 A | 10/1983 | Daniel | |
| 4,432,039 A | 2/1984 | Cibie | |
| 4,496,211 A | 1/1985 | Daniel | |
| 4,529,830 A | 7/1985 | Daniel | |
| 4,539,625 A | 9/1985 | Bornstein et al. | |
| 4,691,994 A | 9/1987 | Afian et al. | |
| 4,697,867 A | 10/1987 | Blanc et al. | |
| 4,798,448 A | 1/1989 | Van Raalte | |
| 4,863,224 A | 9/1989 | Afian et al. | |
| 4,954,930 A | 9/1990 | Maegawa et al. | |
| 5,050,946 A | 9/1991 | Hathaway | |
| 5,089,055 A | 2/1992 | Nakamura | |
| 5,136,480 A | 8/1992 | Pristash et al. | |
| 5,197,792 A | 3/1993 | Jiao et al. | |
| 5,202,950 A | 4/1993 | Arego et al. | |
| 5,220,462 A | 6/1993 | Feldman, Jr. | |
| 5,357,592 A | 10/1994 | Neilson | |
| 5,385,615 A | 1/1995 | Horne | |
| 5,390,085 A | 2/1995 | Mari-Roca et al. | |
| 5,396,350 A | 3/1995 | Beeson et al. | |
| 5,438,485 A | 8/1995 | Li et al. | |
| 5,485,291 A | 1/1996 | Qiao et al. | |
| 5,485,354 A | 1/1996 | Ciupke et al. | |
| 5,521,725 A | 5/1996 | Beeson et al. | |
| 5,528,720 A | 6/1996 | Winston et al. | |
| 5,540,216 A | 7/1996 | Rasmusson | |
| 5,664,862 A | 9/1997 | Redmond et al. | |
| 5,719,649 A | 2/1998 | Shono et al. | |
| 5,806,955 A | 9/1998 | Parkyn, Jr. et al. | |
| 5,838,403 A | 11/1998 | Jannson et al. | |
| 5,839,812 A * | 11/1998 | Ge et al. | 362/607 |
| 5,877,874 A | 3/1999 | Rosenberg | |
| 5,914,760 A | 6/1999 | Daiku | |
| 5,926,601 A | 7/1999 | Tai et al. | |
| 5,977,478 A | 11/1999 | Hibino et al. | |
| 6,011,602 A * | 1/2000 | Miyashita et al. | 349/65 |
| 6,036,340 A | 3/2000 | Fohl et al. | |
| 6,072,551 A | 6/2000 | Jannson et al. | |
| 6,097,549 A | 8/2000 | Jenkins et al. | |
| 6,108,059 A | 8/2000 | Yang | |
| 6,129,439 A | 10/2000 | Hou et al. | |
| 6,139,176 A | 10/2000 | Hulse et al. | |
| 6,193,383 B1 * | 2/2001 | Onikiri et al. | 362/26 |
| 6,201,246 B1 | 3/2001 | Potekev et al. | |
| 6,224,223 B1 | 5/2001 | Higuchi et al. | |
| 6,294,723 B2 | 9/2001 | Uematsu et al. | |
| 6,367,941 B2 | 4/2002 | Lea et al. | |
| 6,379,016 B1 | 4/2002 | Boyd et al. | |
| 6,425,391 B1 | 7/2002 | Davoren et al. | |
| 6,461,007 B1 | 10/2002 | Akaoka | |
| 6,473,554 B1 | 10/2002 | Pelka et al. | |
| 6,541,694 B2 | 4/2003 | Winston et al. | |
| 6,570,710 B1 | 5/2003 | Nilsen et al. | |
| 6,576,887 B2 | 6/2003 | Watson et al. | |
| 6,607,286 B2 | 8/2003 | West et al. | |
| 6,612,709 B2 | 9/2003 | Yamada et al. | |
| 6,623,132 B2 | 9/2003 | Lekson et al. | |
| 6,639,733 B2 | 10/2003 | Minano et al. | |
| 6,647,199 B1 | 11/2003 | Pelka et al. | |
| 6,730,840 B2 | 5/2004 | Sasaoka et al. | |
| 6,811,277 B2 | 11/2004 | Amano | |
| 6,819,687 B1 | 11/2004 | Fein | |
| 6,899,443 B2 | 5/2005 | Rizkin et al. | |
| 6,966,661 B2 | 11/2005 | Read | |
| 6,991,357 B2 * | 1/2006 | Wimbert et al. | 362/603 |
| 7,021,805 B2 | 4/2006 | Amano et al. | |
| 7,046,907 B2 | 5/2006 | Miyashita | |
| 7,083,313 B2 | 8/2006 | Smith | |
| 7,134,778 B2 | 11/2006 | Kazuhiro et al. | |
| 7,160,010 B1 | 1/2007 | Chinniah et al. | |
| 7,309,154 B2 * | 12/2007 | Ohkawa | 362/615 |
| 7,347,611 B2 | 3/2008 | Kwon | |
| 7,371,001 B2 | 5/2008 | Miyashita | |
| 7,438,454 B2 * | 10/2008 | Chinniah et al. | 362/500 |
| 7,467,879 B2 * | 12/2008 | Herloski et al. | 362/310 |
| 7,548,670 B2 * | 6/2009 | Ijzerman et al. | 385/33 |
| 7,581,867 B2 * | 9/2009 | Lee et al. | 362/620 |
| 7,614,768 B2 * | 11/2009 | Stanitzok et al. | 362/327 |
| 7,808,577 B2 * | 10/2010 | Kimura | 349/65 |
| 2003/0063474 A1 | 4/2003 | Coushaine | |
| 2003/0067760 A1 | 4/2003 | Jagt et al. | |
| 2003/0075167 A1 | 4/2003 | Minano Dominguez et al. | |
| 2003/0075212 A1 | 4/2003 | Chen | |
| 2004/0103938 A1 | 6/2004 | Rider | |
| 2004/0120157 A1 * | 6/2004 | Bottesch et al. | 362/487 |
| 2005/0111235 A1 | 5/2005 | Suzuki et al. | |
| 2005/0129358 A1 | 6/2005 | Minano et al. | |
| 2005/0243570 A1 | 11/2005 | Chaves et al. | |
| 2005/0254259 A1 | 11/2005 | Yamashita et al. | |
| 2006/0072222 A1 | 4/2006 | Lichy | |
| 2006/0077692 A1 | 4/2006 | Noh et al. | |
| 2006/0098929 A1 | 5/2006 | Steenblik et al. | |
| 2006/0207650 A1 | 9/2006 | Winston et al. | |
| 2007/0047260 A1 | 3/2007 | Lee et al. | |
| 2007/0171418 A1 | 7/2007 | Nyhart, Jr. | |
| 2007/0246040 A1 | 10/2007 | Schaafsma | |
| 2007/0251568 A1 | 11/2007 | Maeda | |
| 2008/0048102 A1 | 2/2008 | Kurtz et al. | |
| 2008/0087323 A1 | 4/2008 | Araki et al. | |
| 2008/0165437 A1 | 7/2008 | DiDomenico | |
| 2008/0184989 A1 | 8/2008 | Mecham | |
| 2008/0223443 A1 | 9/2008 | Benitez et al. | |
| 2008/0257408 A1 | 10/2008 | Chen et al. | |
| 2008/0264486 A1 | 10/2008 | Chen et al. | |
| 2008/0271776 A1 | 11/2008 | Morgan | |
| 2009/0126792 A1 | 5/2009 | Gruhlke et al. | |
| 2010/0024868 A1 | 2/2010 | Baruchi et al. | |
| 2010/0037954 A1 | 2/2010 | Thony | |
| 2010/0065120 A1 | 3/2010 | McDonald | |
| 2010/0108124 A1 | 5/2010 | Knox et al. | |
| 2010/0116336 A1 | 5/2010 | Martinez Anton et al. | |
| 2010/0165495 A1 | 7/2010 | Murtha | |

FOREIGN PATENT DOCUMENTS

| | | |
|---|---|---|
| EP | 1895228 A1 | 3/2008 |
| EP | 2061093 A1 | 5/2009 |
| EP | 2077586 A1 | 7/2009 |
| ES | P200803237 | 11/2008 |
| FR | 2872256 A1 | 12/2005 |
| GB | 1570684 A | 7/1980 |
| JP | 2001289515 A | 10/2001 |
| JP | 2003258291 A | 9/2003 |
| JP | 2005019587 A | 1/2005 |
| JP | 2005123036 A | 5/2005 |
| WO | 9826212 A1 | 6/1998 |
| WO | 0244766 A2 | 6/2002 |
| WO | 2004114418 A1 | 12/2004 |
| WO | 2006010249 A1 | 2/2006 |
| WO | 2006064365 A2 | 6/2006 |
| WO | 2006088369 A2 | 8/2006 |
| WO | 2007045917 A2 | 4/2007 |
| WO | 2008001277 A2 | 1/2008 |
| WO | 2008058245 A2 | 5/2008 |
| WO | 2008092679 A1 | 8/2008 |
| WO | 2008103987 A2 | 8/2008 |
| WO | 2008/131561 A1 | 11/2008 |
| WO | 2009001106 A2 | 12/2008 |
| WO | 2009041330 A1 | 4/2009 |
| WO | 2009058619 A2 | 5/2009 |
| WO | 2009063416 A2 | 5/2009 |
| WO | 2009064701 A1 | 5/2009 |
| WO | 2009086293 A2 | 7/2009 |
| WO | 2010033859 A2 | 3/2010 |
| WO | 2010040053 A1 | 4/2010 |

OTHER PUBLICATIONS

Supplementary Search Report of EP 08748249; Sep. 16, 2011; Marc Ley.
Document "Chapter 2: Holographic Methods".
The William L. Bonnell Company, "Extrusion Process Description".
"Plastic and Their Properties".
"High Reflectors".
"Plexiglas Acrylic Molding Resin", 2008, Altuglas International.

Plexiglas Acrylic Molding Resin "Extrusion", 2008, Altuglas International.
JDSU "Thin Film Custom Optics", Dec. 2007.
"Meisner Acrylic Casting".
English Abstract of FR2872256.
English Abstract of JP2001289515.
English Abstract of JP2003258291.
English Abstract of JP2005019587.
English Abstract of JP2005123036.
English Abstract of EP1895228.
English Abstract of DE19937448.
Benitez et al., "High Performance Fresnel-based Photovoltaic Concentrator", Apr. 26, 2010, Optical Society of America, vol. 18, No. S1.

Winston et al., "Planar Concentrators Near the Étendue Limit", Oct. 1, 2005, Optical Society of America, vol. 30, No. 19.
Chaves et al.: "Ideal Concentrators with Gaps", Mar. 1, 2002, Applied Optics, vol. 41, No. 7, pp. 1267-1276.
Chaves et al.: "Ultra Flat Ideal Concentrators of High Concentration", 2000, Solar Energy, vol. 69, No. 4, pp. 269-281.
Ghosh et al.: "A New Approach to Concentrating and Aggregating Light Energy", Jun. 2007.
U.S. Appl. No. 12/705,415, filed Feb. 12, 2010; Title: Light-Guide Solar Panel and Method of Fabrication Thereof.

* cited by examiner

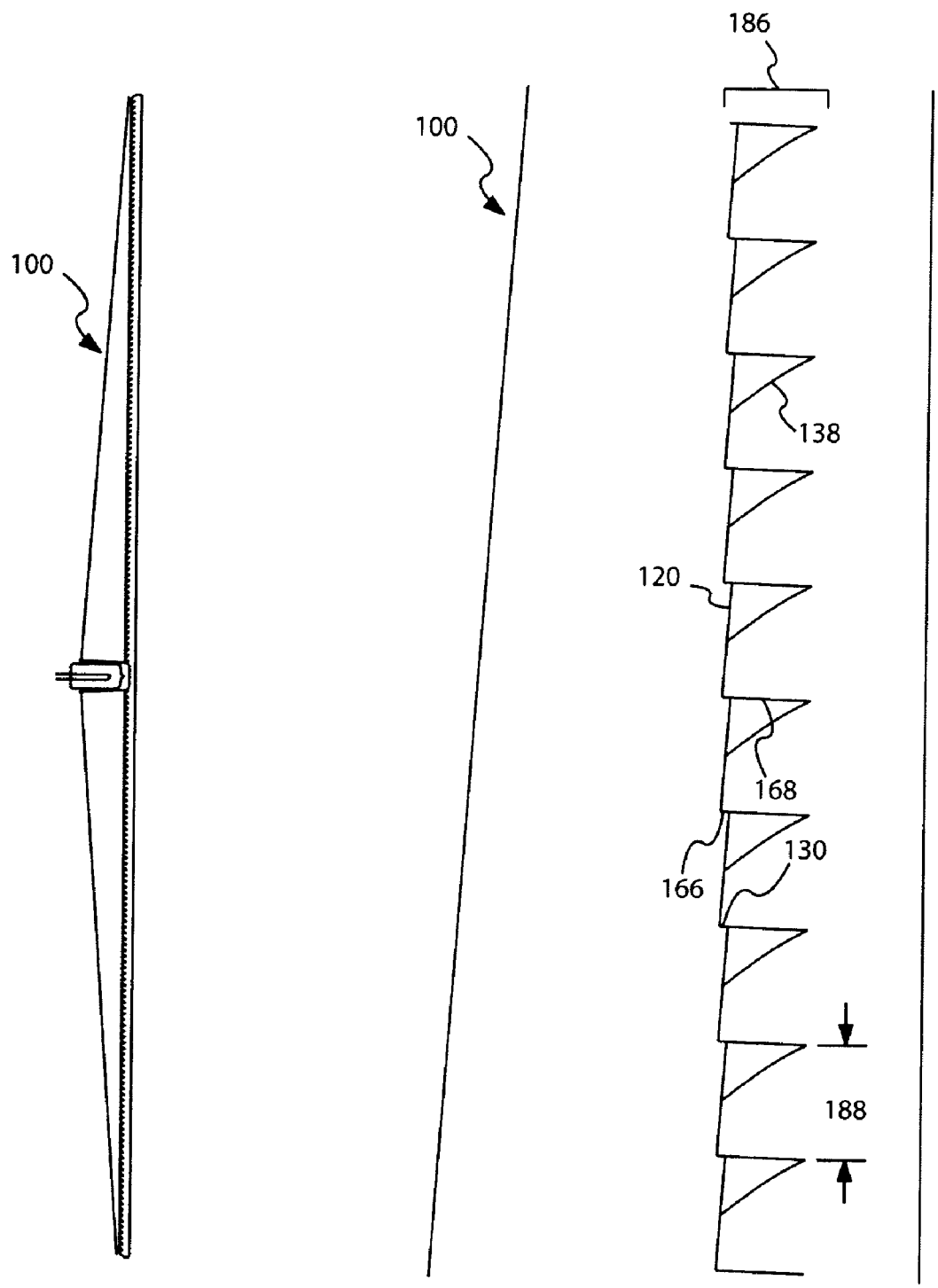
Fig 11A                    Fig 11B

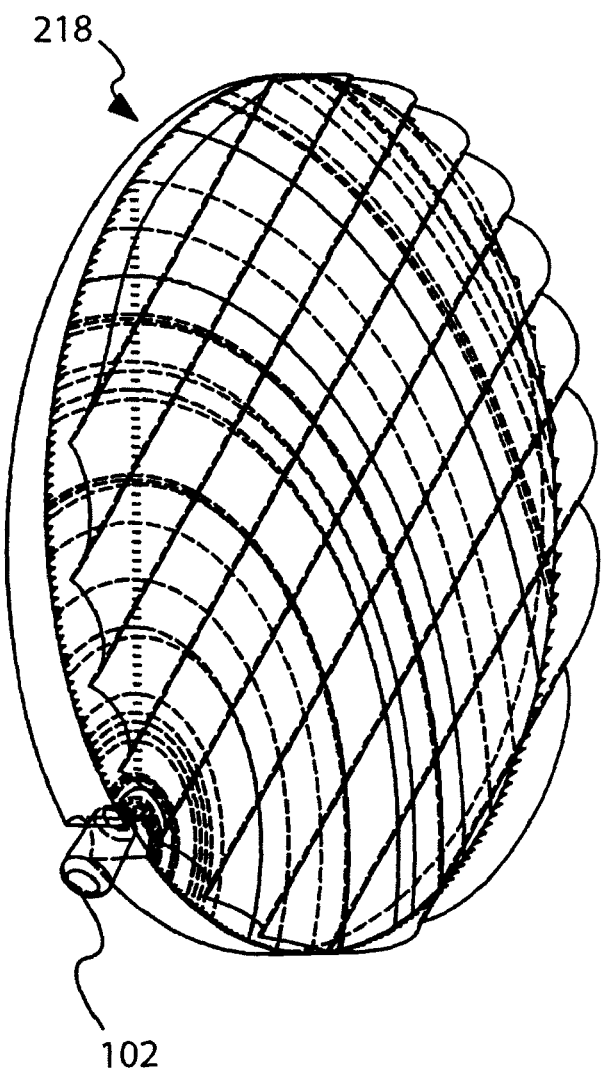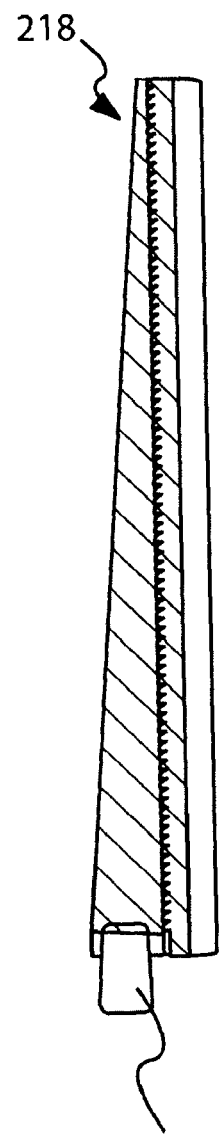
Fig 18A
Fig 18B

ILLUMINATION DEVICE

CROSS REFERENCE TO RELATED APPLICATIONS

This application is the U.S. National Stage of International Patent Application No. PCT/CA2008/000847, filed May 1, 2008. The following applications are incorporated by reference herein in their entirety: U.S. Provisional Patent Application No. 60/915,207 filed May 1, 2007; U.S. Provisional Patent Application No. 60/942,745 filed Jun. 8, 2007; and U.S. Provisional Patent Application No. 60/951,775 filed Jul. 25, 2007.

FIELD OF THE INVENTION

The present invention relates generally to collimating optics. More particularly, the present invention relates to light-guiding collimator optics for luminaires.

BACKGROUND OF THE INVENTION

Luminaires that collimate light from an isotropic source to form a beam of light are known. The optical elements of the luminaires can be either lenses or mirrors, and the isotropic light source can be an incandescent bulb, a fluorescent bulb, or a light emitting diode. Light is emitted from the bulb in all directions and interacts with the optical elements, and is redirected to make a beam in which all the rays of light are substantially parallel.

One widespread application for such luminaires is automotive headlamps. In a typical automotive headlamp, a bulb is positioned at the focal point of a parabolic reflector. Light emanates from the bulb in all directions and strikes the parabolic reflector, which collimates the light into a beam. In general these automotive headlamps have considerable depth, occupying space in the car. Other exemplary applications include products such as, amongst others, stage lighting, flashlights, medical lighting and dentistry lighting.

Parabolic reflector can also be upwards of 20 cm deep for an automotive headlamp and a cover is also required to protect the bulb and reflector cavity. Additionally, though automotive headlamps are generally made by injection molding poly(methyl-methacrylate) (PMMA) or poly carbonate, the clear polymers must be coated in a reflective mirror coating in order to operate correctly. The polymers used to make these assemblies are recyclable with a high recovery value, but the mirror coating complicates the recycling process and reduces the recovery value.

Therefore, it is desirable to provide a collimating luminaire that is considerably less bulky than existing options. It is also desirable to provide a luminaire that does not need a cover, and which does not require any mirror coatings in order to function.

SUMMARY OF THE INVENTION

It is an object of the present invention to obviate or mitigate at least one disadvantage of previous illumination devices.

In a first aspect, the present invention provides an illumination device that comprises a light-projecting stage having at least one optical input aperture, an output surface, and optical elements formed between the at least one optical input aperture and the output surface. The device further comprises an optical waveguide stage optically coupled to the at least one optical input aperture, the optical waveguide stage having an input surface to receive light and a waveguide section to guide the light from the input surface to the at least one optical input aperture, the optical elements directing the light from the at least one input aperture to the output surface wherefrom the light exits as a beam.

In further aspect, the present invention provides an illumination device that comprises a first light-projecting stage having a first at least one optical input aperture, a first output surface, and first optical elements formed between the first at least one optical input aperture and the first output surface. The device also comprises a second light-projecting stage having a second at least one optical input aperture, a second output surface, and second optical elements formed between the second at least one optical input aperture and the second output surface. The device further comprises an optical waveguide stage optically coupled to the first at least one optical input aperture and to the second at least one optical input aperture, the optical waveguide stage having a first input surface to receive a first light from a first light source and a second input surface to receive a second light from a second light source. The optical waveguide further has a waveguide section to guide the first light from the first input surface to the first at least one optical input aperture, the first optical elements directing the first light from the first at least one input aperture to the first output surface wherefrom the first light exits as a first beam. The waveguide section also to guide the second light from the second input surface to the first at least one optical input aperture and to the second at least one optical input aperture, the first optical elements and the second optical elements directing the second light respectively from the first at least one input aperture to the first output surface and from the second at least one input aperture to the second output surface, the second light exiting form the first and second output surface forming a second beam.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 11A shows an embodiment of the light-guide collimating optic of the present invention where small functional elements are implemented;

FIG. 11B shows an enlarged view of the embodiment of FIG. 11A;

FIG. 18A shows a perspective view of an embodiment of the light-guide collimating optic of the present invention where the optic consists of a circular section of the embodiment of FIG. 16 and the isotropic light source is edge-mounted;

FIG. 18B shows a complete cross-sectional view of the embodiment of FIG. 18A;

DETAILED DESCRIPTION

Generally, the present invention is a luminaire that uses a light-guide collimating optic (LGCO), which can also be referred to as an illumination device. The LGCO accepts light from a small isotropic light source such as a light emitting diode (LED) or a bulb and spreads the light over a wide area while also collimating it to form a beam wherein all the rays are substantially parallel. The LGCO includes of a thin slab of optically transmissive material with an emitter face, out of which light emerges collimated, and a smaller input face, located on the edge of the LGCO. There can be more than one input face on an LGCO.

The LGCO has two stages, a waveguide stage (also referred to as an optical waveguide stage and which includes a waveguide section) and a collimating stage (also referred to as a light-projecting stage). Light inserted into the LGCO at an input face is guided internally by total internal reflection in the waveguide stage and spreads substantially evenly over the LGCO. Light then couples into the collimating stage via a multiplicity of apertures (also referred to as optical input apertures) that allow light to escape the waveguide stage. The LGCO can be cut circularly, squarely, or in any other shape. The light beam emerges substantially collimated. Alternatively, the light beam can also be shaped in a variety of ways, and made to diverge to any desired degree in one plane or in two planes.

It is also possible to build the LGCO such that it accepts light from two sources so that the emerging light differs with each source. For example, one could make a high-beam/low-beam arrangement whereby one bulb produces a beam of light aimed slightly downward, and another bulb produced a beam in the same LGCO aimed horizontally or slightly upward.

Figure 1:
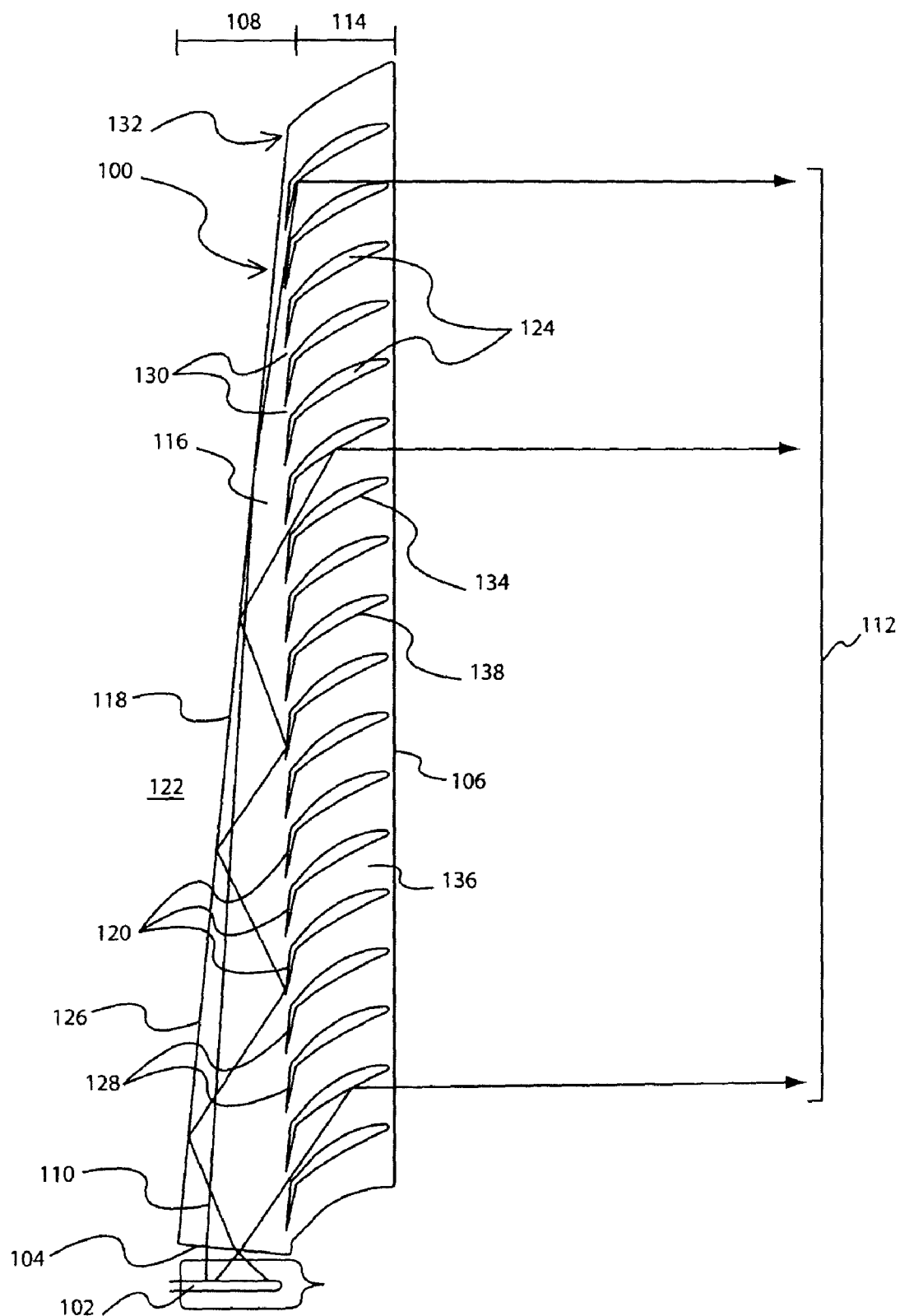
FIG. 1 shows a first embodiment of the light-guide collimating optic of the present invention.

FIG. 1 shows the first embodiment of the LGCO 100. Light is emitted from an isotropic light source 102 placed at the edge 104 (also referred to as an input surface) of the LGCO 100 and emerges from an emitter face 106 (also referred to as an output surface) collimated. The LGCO 100 has a waveguide stage 108 into which light 110 from the isotropic source 102 is first inserted and guided. It also has a collimating stage 114 that shapes and directs the final beam 112. The waveguide stage 108 and the collimating stage can be made of any appropriate optical material 116 (e.g., PMMA). The waveguide stage 108 has one face 118 (also referred to as a first surface) on its back and a multiplicity of interfaces 120 on its front side. The face 118 is an interface between the optical material 116 and the exterior material 122. The exterior material 122 can be a gas or another material of lower index of refraction than the optical material 116. The multiplicity of interfaces 120 separate the optical material 116 from another material or gas of lower index of refraction 124. The interface 118 makes a reflector 126 that operates on the light 110 by total internal reflection. The multiplicity of interfaces 120 also makes reflectors 128 that operate on the light 110 by total internal reflection. The backside reflector 126 and the multiplicity of front side reflectors 128 can be substantially parallel.

Figure 2:
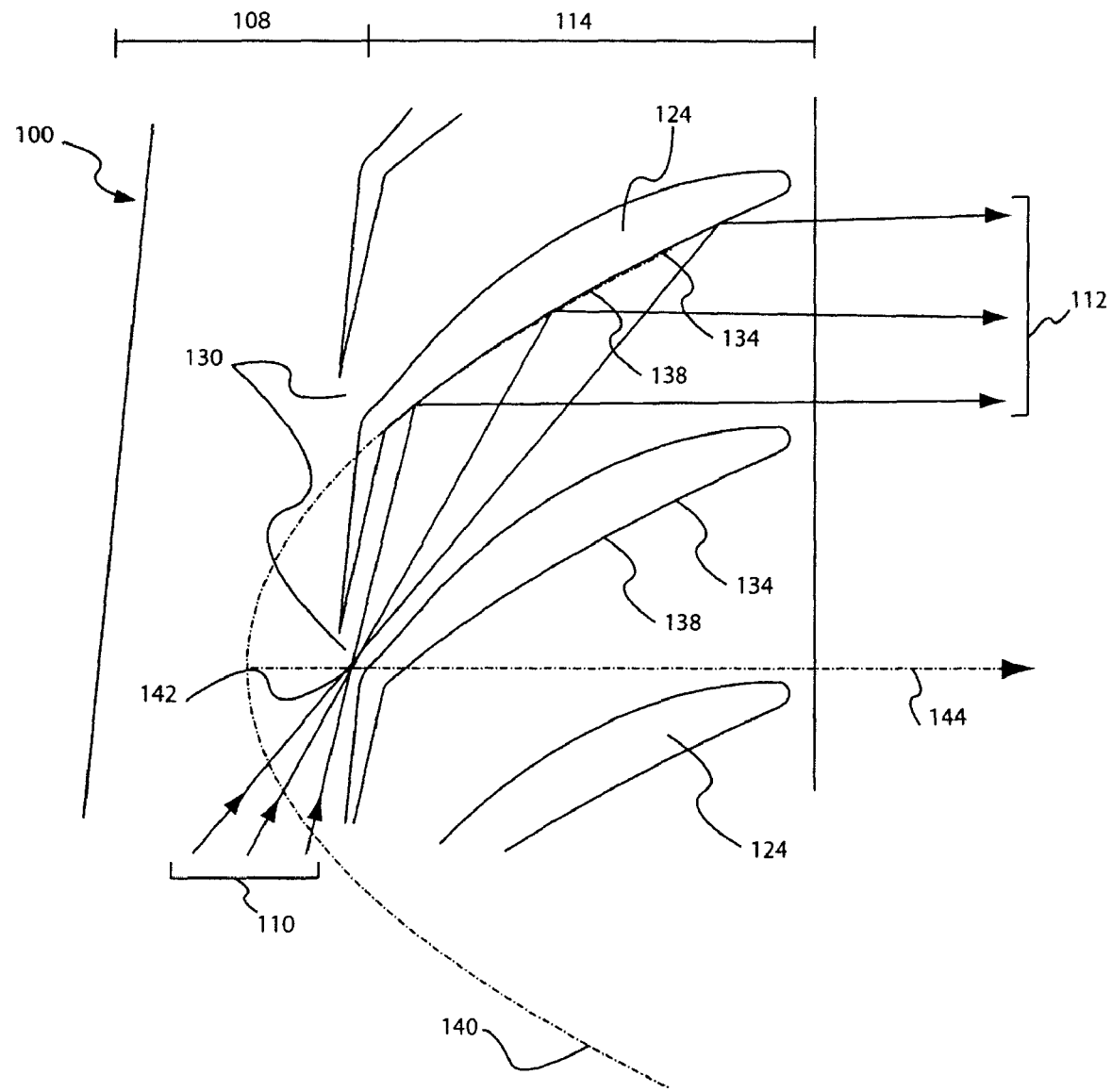
FIG. 2 shows an enlarged view of the embodiment of FIG. 1 with light rays entering the collimating stage.

Light 110 traveling in the waveguide stage 108 encounters apertures 130 (also referred to as optical input apertures), each of which is an exit location from the waveguide stage 108. At each subsequent aperture 130, the waveguide stage 108 becomes narrower, so that the waveguide stage 108 tapers from thickest near the lamp source 102 to the thinnest at the outside edge of the waveguide stage 132. At each aperture 130, light 110 exits the waveguide stage 108 and enters the collimating stage 114. FIG. 2 shows three rays 110 at different angles exiting the waveguide stage 108 via the aperture 130 and entering the collimating stage 114. The rays 110 reach an interface 134, which has a parabolic shape. The interface 134 separates the optical material 136 comprising the collimating stage 114 from the gas or lower index of refraction material 124. The interface 134 thus creates a reflector 138 that operates by total internal reflection—although this reflector 138 can also have a mirrored surface. The light rays 110 impinging on the reflector 138 can be collimated (made parallel) and immediately exit the LGCO 100 out the emitter face 106.

For optimal collimation the reflector 138 is a parabolic section. However, this reflector can also be a round section, or any other appropriate shape or a circular approximation of the optimal parabolic section. For the parabolic case, the parabola 140 which describes the reflector 138 has a focal point 142 which is coincident with the aperture 130, and the axis of the parabola 144 points in the output direction of the beam—in this case, normal to the emitter face 106 of the LGCO 100. Light 110 entering the collimating stage 114 from the aperture 130 can be thought of as diverging from the focus 142 of the parabola 140 because the focus 142 of the parabola 140 and the aperture 130 are coincident, and the aperture 130 is narrow. A parabolic reflector 138 collimates light 110 that is diverging from its focus 142 in a direction parallel to the axis 144 of the parabola 140.

Figure 3:
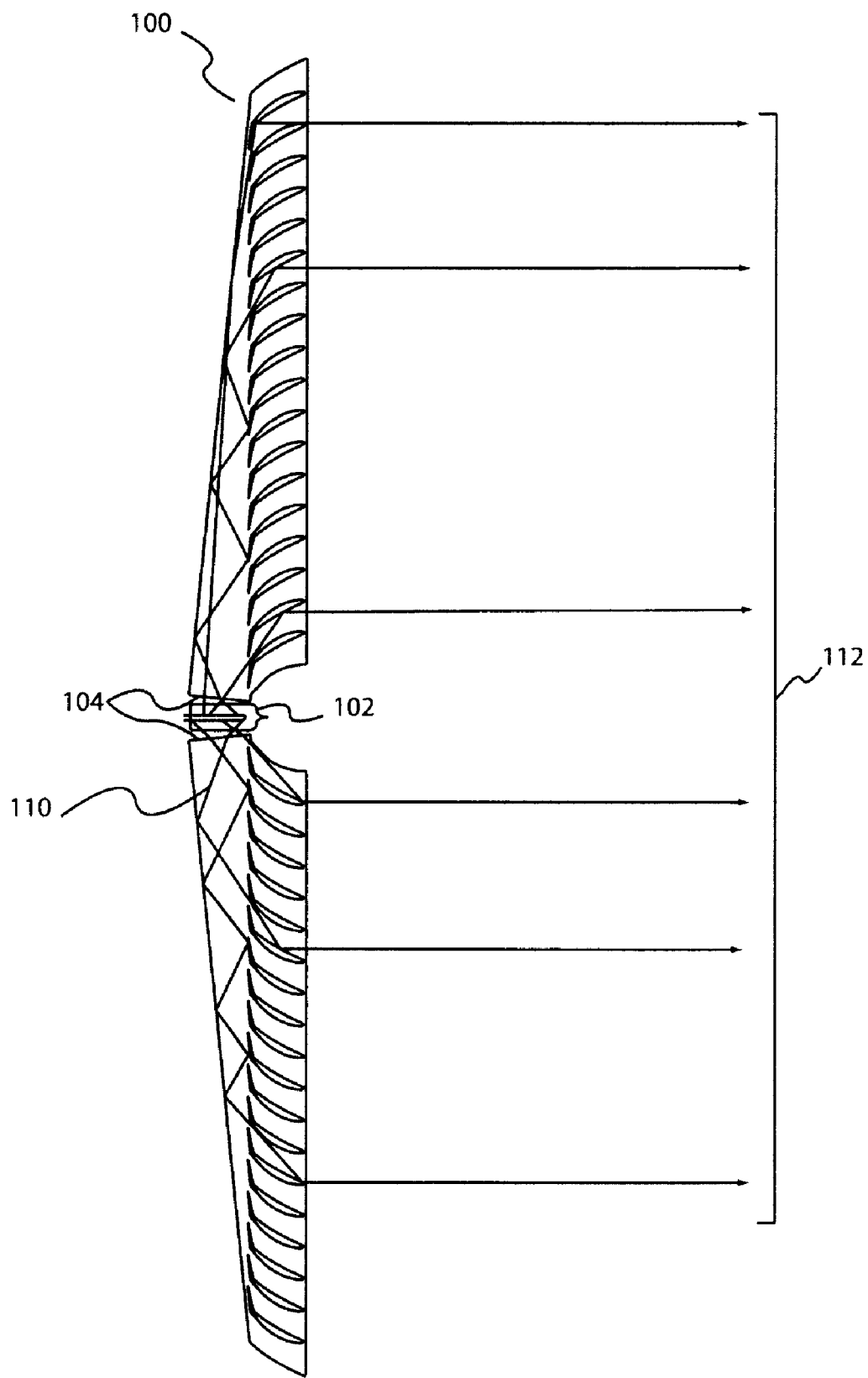
FIG. 3 shows the embodiment of FIG. 1 with an isotropic light source at the center of the optic.

The LGCO 100 can be used with a bulb 102 on one edge as shown previously or with the bulb 102 in the center of the LGCO 100. This is shown in FIG. 3. The cross-section from FIGS. 1-3 can be made into a linear optic in which case light 110 would be inserted along the whole edge of the optic 104 (an example is shown in FIG. 12).

Figure 4:
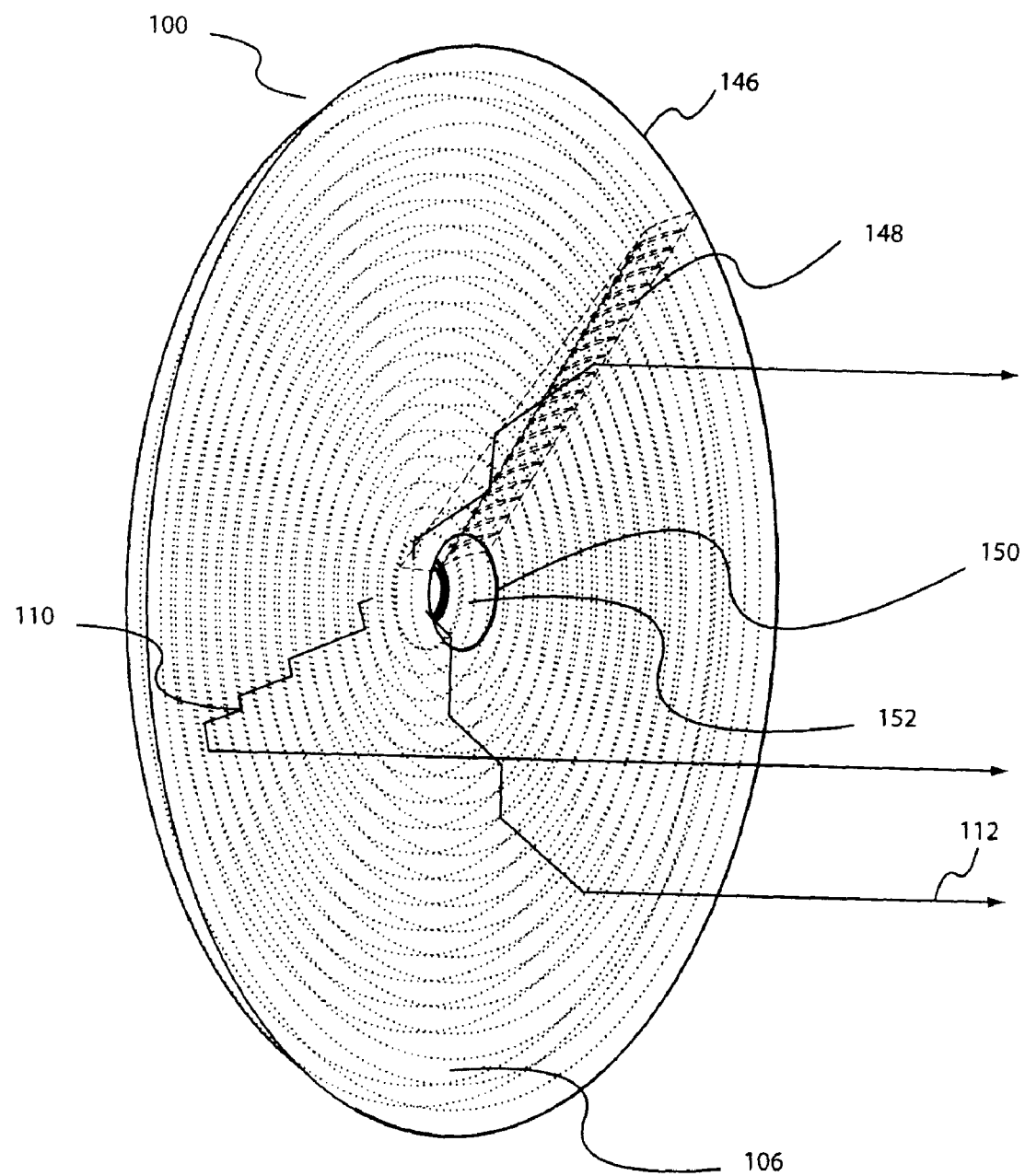
FIG. 4 shows a perspective view of the revolved geometry embodiment of the light-guide collimating optic of the present invention.
Figure 5A:
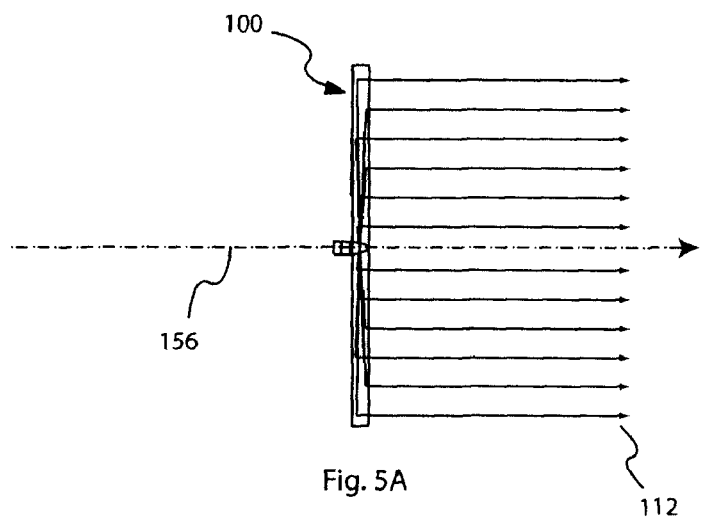
FIG. 5A shows the embodiment of FIG. 3 with light rays exiting the emitter face.
Figure 5B:
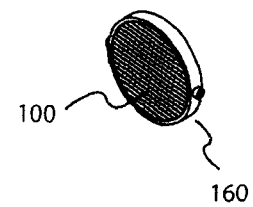
FIG. 5B shows a perspective view of the embodiment of FIG. 4 in a housing.
Figure 5C:
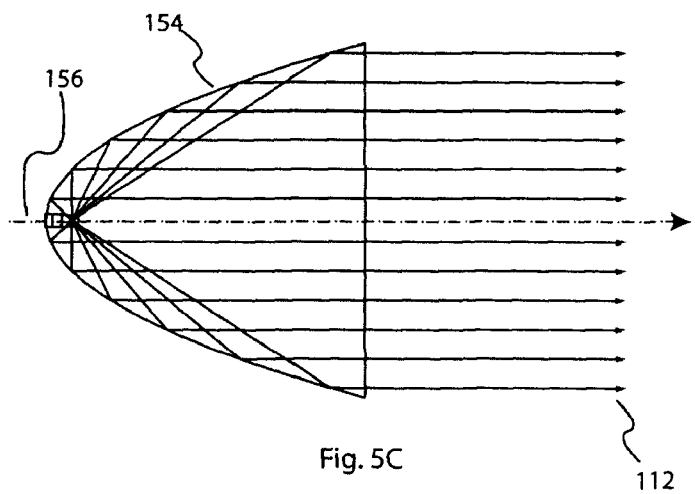
FIG. 5C shows a simple parabolic reflector spot lamp.
Figure 5D:
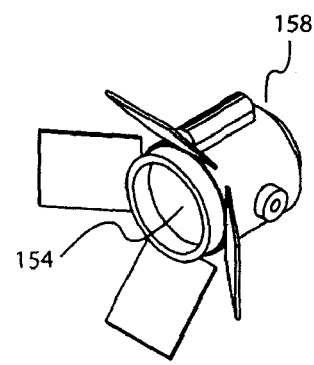
FIG. 5D shows a perspective view of a spot lamp.

FIG. 4 shows a revolved LGCO 100 that is shaped like a discus 146. The cross-section 148 is shown stippled in the figure, and is the same as FIG. 1. The discus 146 has a hub 150 in its center that can accept a bulb. Light 110 enters the discus 146 via a circular wall 152 of the hub 150. Light 110 then propagates as before and exits as a collimated beam 112 out the emitter face 106.

In the preceding FIGS. 1-3, if the apertures 130 are tightened, then a point source is more closely approximated from the perspective of the parabolic reflectors 138; therefore the light 110 emerging from the system will be more collimated.

If the apertures 130 are widened, then the opposite happens, and a more divergent beam will emerge from the LGCO 100. This is a design tool that can be used to achieve the desired divergence. The tapering of the waveguide stage 108 depends on the width of the apertures 130, so narrower apertures 130 will make the waveguide stage 108 taper more gradually, and wider apertures 130 will make it taper more quickly.

FIG. 5 shows a comparison between the LGCO 100 and a simple parabolic reflector 154. Both optics produce a collimated beam 112, but the LGCO 100 is considerably more compact along the optical axis 156 of the collimated light 112. FIG. 5B exemplifies this compactness using the example of a spot-lamp 158 and a LGCO in a housing 160 of the same diameter.

In actuality, it could be difficult to manufacture the LGCO 100 in one piece as shown in FIGS. 1-4. An easier process to mold the LGCO 100 by injection molding, compression molding, or another suitable means is to split the LGCO 100 into two slabs which each have no undercuts and which fit together. These parts can be dry-fitted together and require no welding or optical bonding.

Figure 6A:
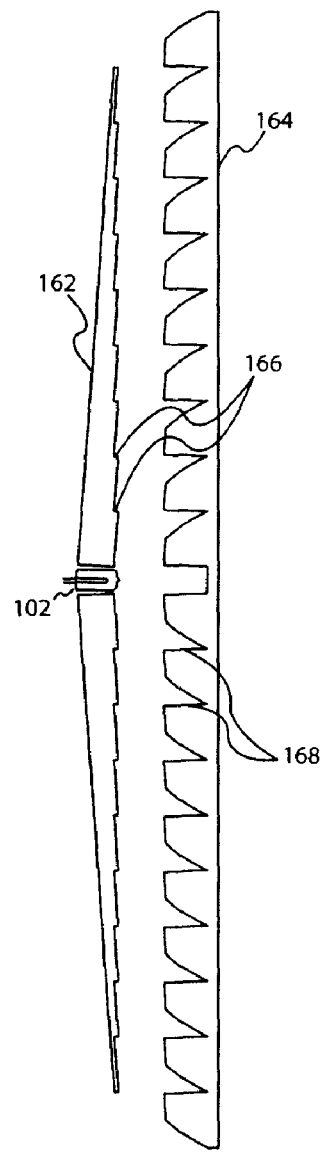
FIG. 6A shows an exploded view of a slab design embodiment of FIG. 3.
Figure 6B:
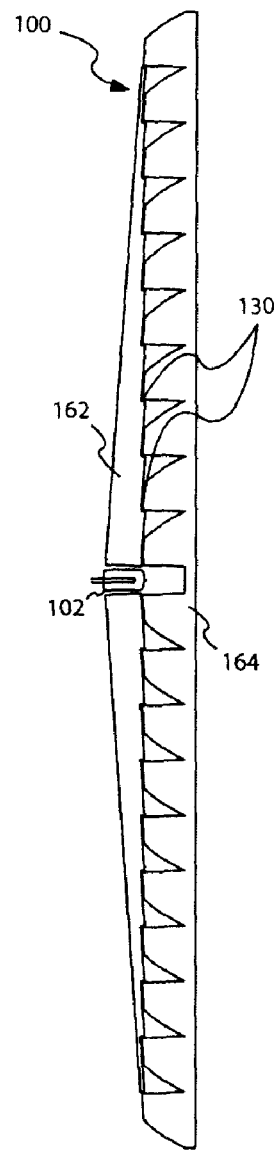
FIG. 6B shows an intact view of a slab design embodiment of FIG. 3.
Figure 6C:
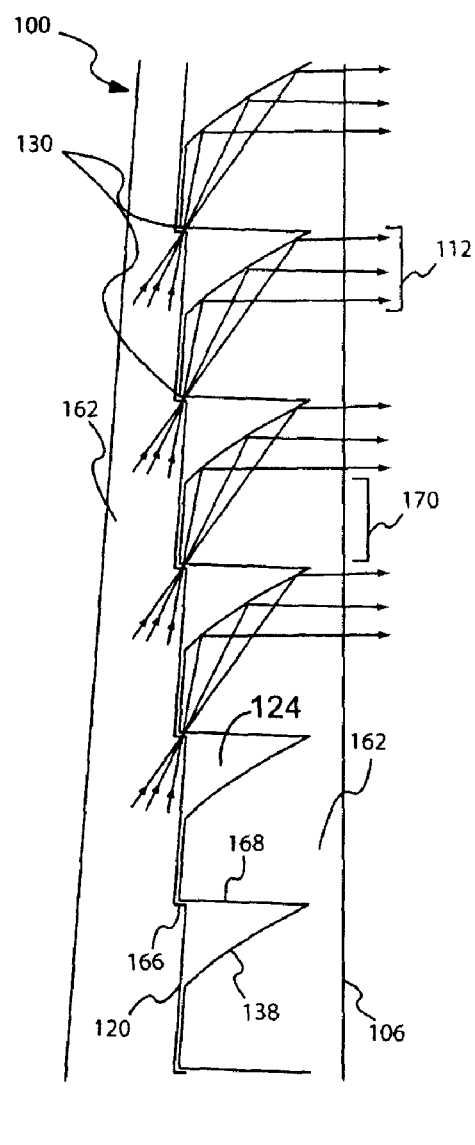
FIG. 6C shows an enlarged view of a slab design embodiment of FIG. 3.
Figure 7A:
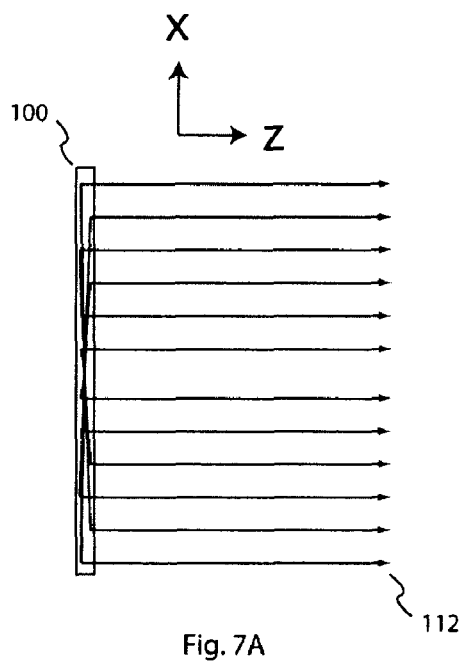
FIG. 7A shows a computer simulation in the XZ plane of the embodiment of FIG. 3.
Figure 7B:
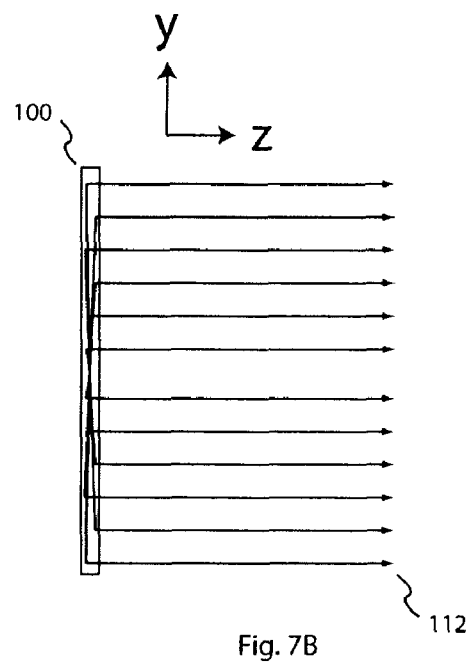
FIG. 7B shows a computer simulation in the YZ plane of the embodiment of FIG. 3.
Figure 7C:
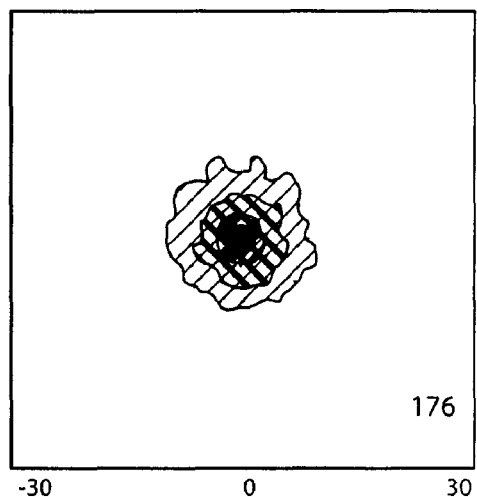
FIG. 7C shows the intensity relief plot from a computer simulation of the embodiment of FIG. 3.
Figure 7D:
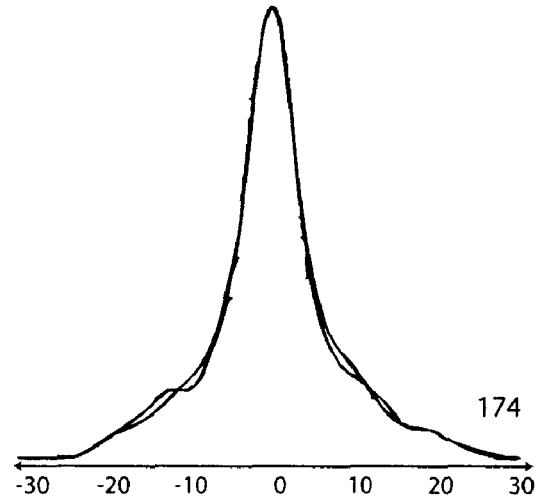
FIG. 7D shows the intensity profile from a computer simulation of the embodiment of FIG. 3.

The division is shown in FIG. 6, with the waveguide stage 108 comprising one slab 162 and the collimating stage 114 comprising another slab 164. The waveguide stage 108 has exit faces 166 through which light 110 can escape, and it is coupled into the collimating stage 114 through an injection face 168 abutting the exit face 166. The exit faces 166 and injection faces 168 make apertures 130 between the waveguide stage 108 and the collimating stage 114. FIG. 6 shows light 110 striking the reflectors 138 after exiting the apertures 130 and making collimated beams 112. In the present example, the beams 112 emerging from the reflectors 138 in the collimating stage slab 164 do not cover the whole emitter face 106. There is a dead space 170 where no beam 112 exits the LGCO 100. This creates bands of collimated light. In the case of a revolved LGCO, the effect would be concentric rings of light emanating from the optic. In practice however, a small degree of divergence in the light would render the rings imperceptible beyond a short distance, and the light exiting the optic would appear as a unified, solid beam.

This effect plays out in computer modeling, and FIG. 7 shows these results. A 20 cm diameter revolved LGCO 100 was modeled and the profile 174 of the light beam analyzed at a distance of 1 meter from the optic 100; dimensions on the figure are in centimeters and the intensity of the beam is on an arbitrary scale. As is clear from the profiles 174 and the relief plot 176, the beam is roughly Gaussian. The simulation was done with a finite number of rays and accounts for the noise in the profiles 174 and relief plot 176.

Figure 8:
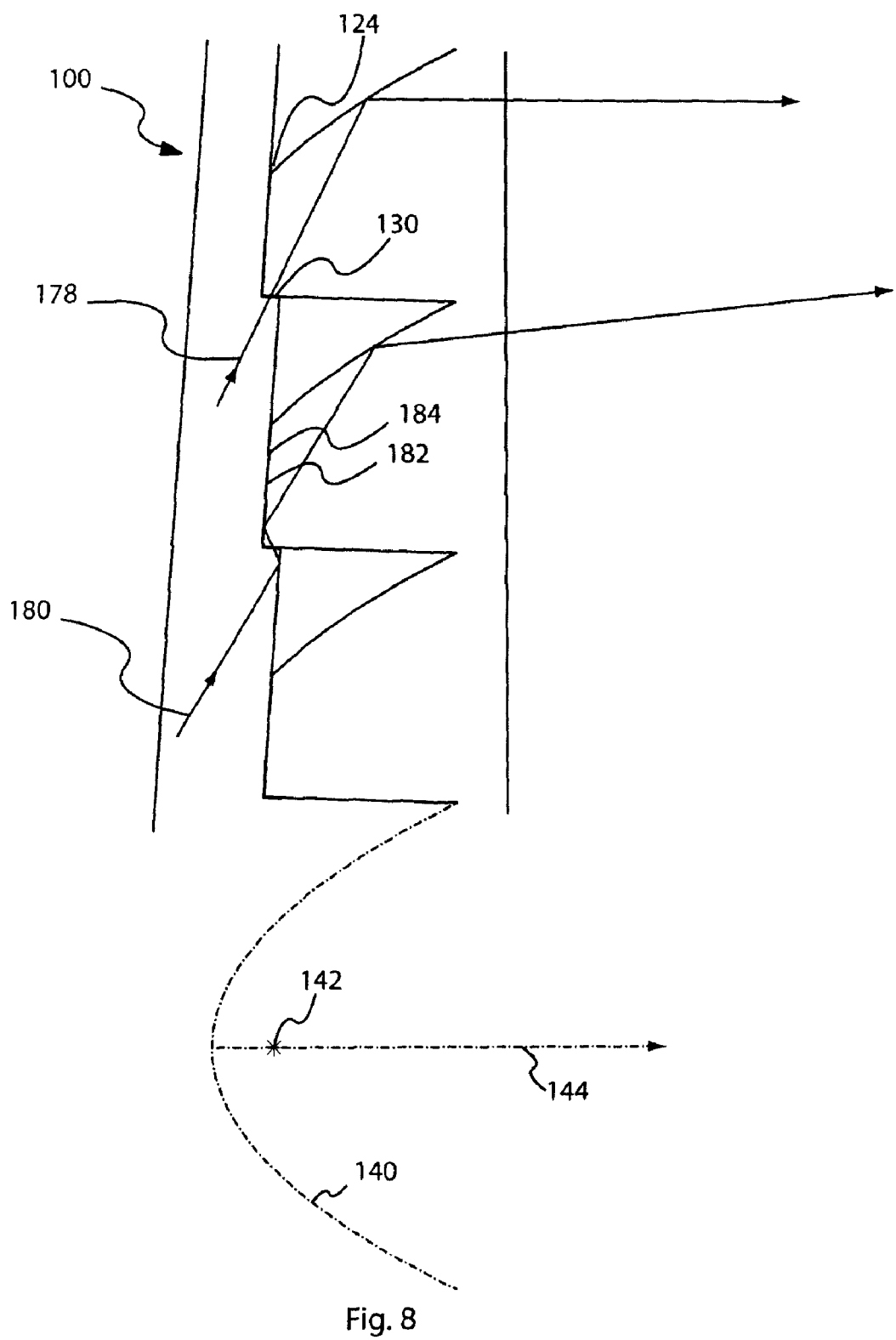
FIG. 8 shows an embodiment of the light-guide collimating optic of the present invention where light rays undergo one or two reflections in the collimating stage.

FIG. 8 shows rays 178 and 180 exiting the waveguide stage 108 at the apertures 130. Rays exiting the waveguide stage 108 and entering the collimating stage 114 can go through one of two processes, both of which are described here. Ray 178 enters the collimating stage 114, immediately strikes the reflector 138, and then exits the LGCO 100. Ray 180 enters the collimating stage 114 and reflects off the bottom face 182 of the collimating stage 114 then subsequently off the reflector 138 before exiting the LGCO 100. The face 182 is parallel to the backside face 118 of the waveguide stage 108. The face 182 is an interface between the optical material 136 and the gas or lower index of refraction material 124 between the collimating stage 114 and the wave-guide stage 108 (not visible in FIG. 8 but shown clearly at FIG. 6C). This interface 182 makes a reflector 184 operating under total internal reflection.

FIG. 8 also shows the parabola 140 that prescribes the reflectors 138 in the collimating stage 114. This parabola 140 has its focus 142 coincident with the center of the apertures 130 that link the waveguide stage 108 and the collimating stage 114, and the axis 144 of the parabola 140 points in the direction of the beam 112.

Figure 9:
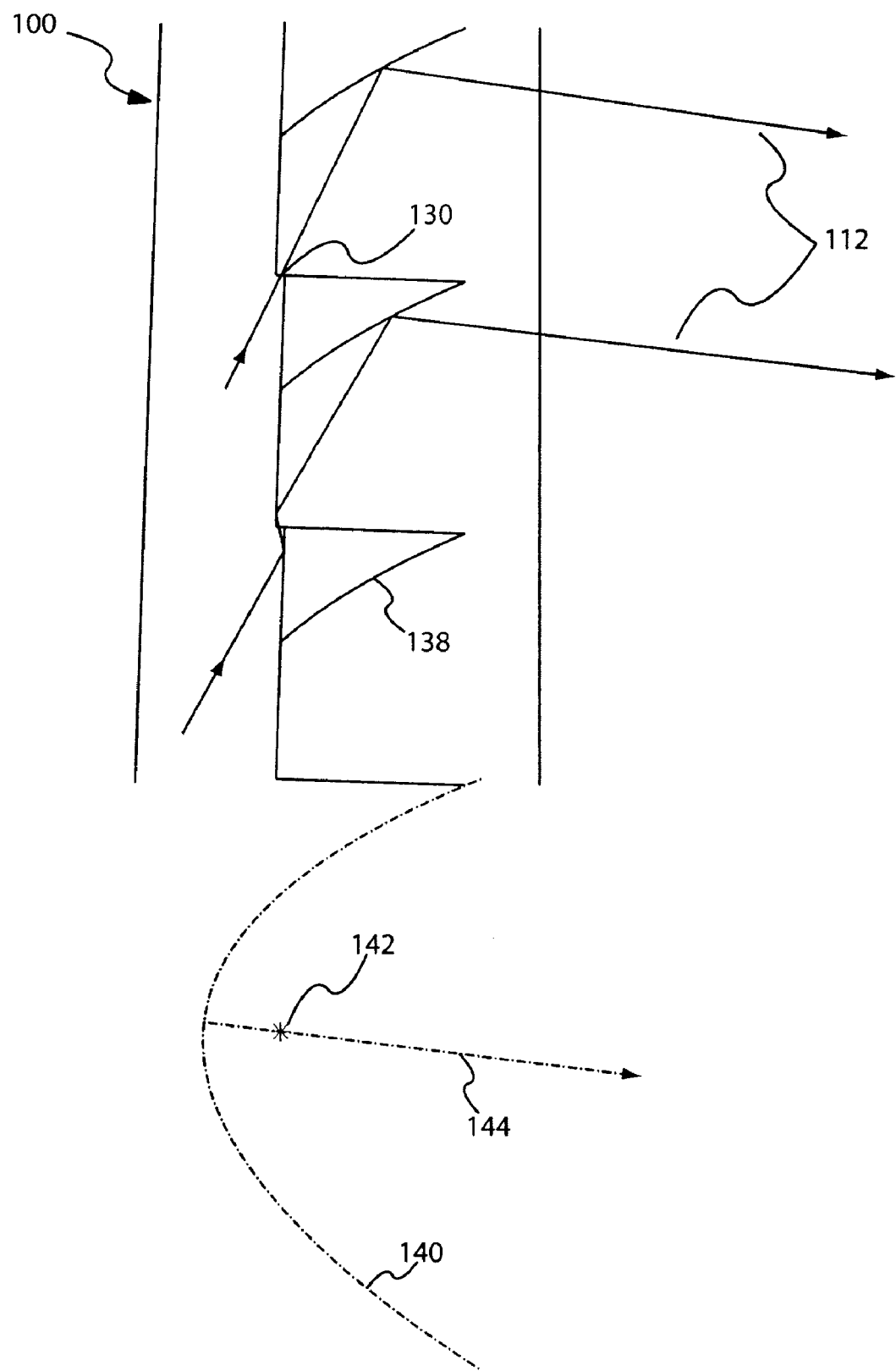
FIG. 9 shows an embodiment of the light-guide collimating optic of the present invention where parabolic reflectors are oriented to directed light downwards in the collimating stage.

FIG. 9 shows how one can control the direction of the collimated beam by altering the parabola 140, which is used to prescribe the reflectors 138. The axis 144 of the parabola 140 has been angled downward. If this is done while maintaining the focus 142 of the parabola 140 coincident with the center of the apertures 130 then the resultant beam 112 will be collimated and angled downwards.

Figure 10:
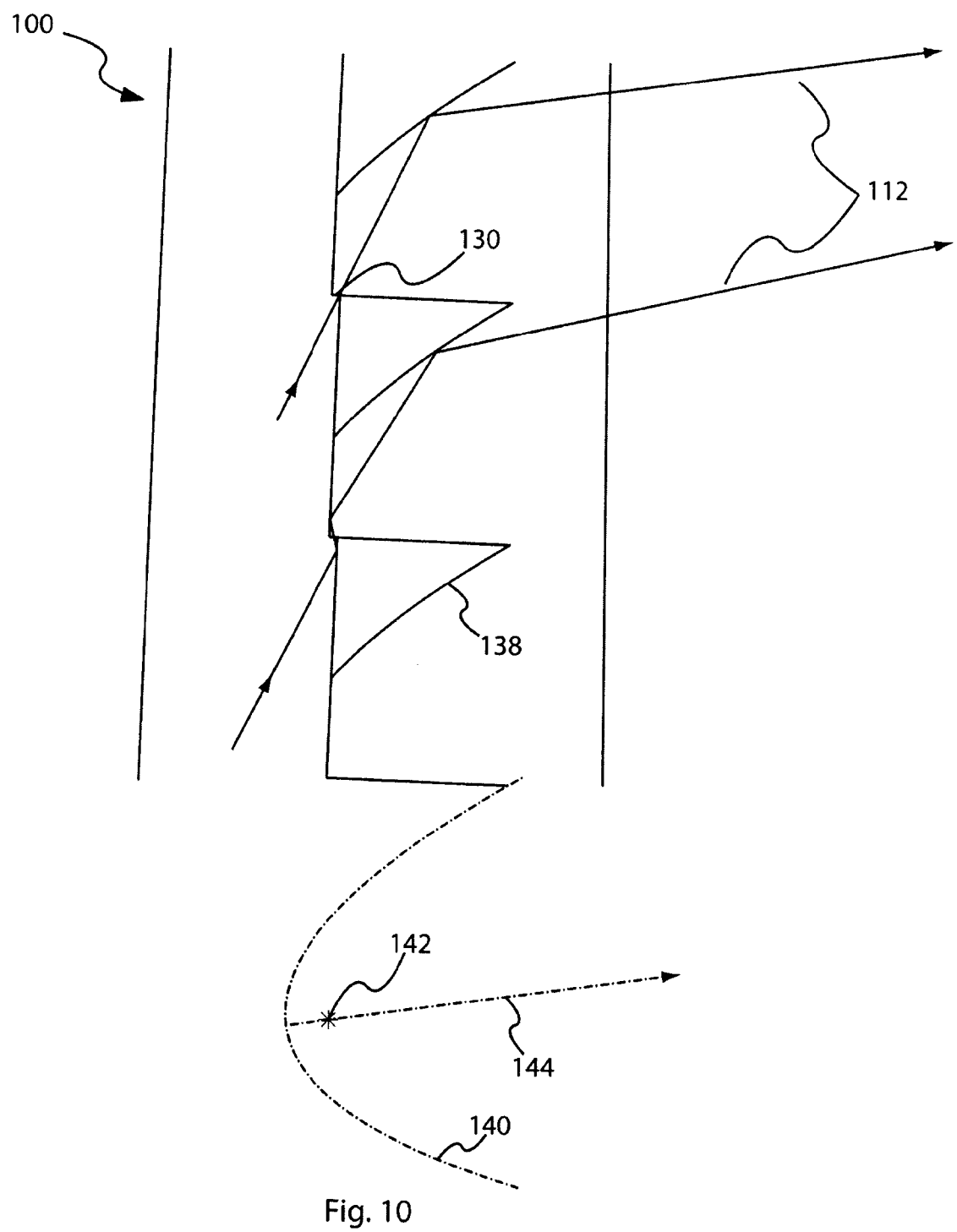
FIG. 10 shows an embodiment of the light-guide collimating optic of the present invention where parabolic reflectors are oriented to direct light upwards in the collimating stage.

FIG. 10 shows a similar embodiment as FIG. 9 except that the axis 144 of the parabola 140 has been angled upwards and the corresponding beam 112 will also be collimated and angled upward.

The net result of altering the parabolic reflectors 138 by tilting the parabola's axis 144 on a revolved LGCO 100 would be to increase the divergence of the beam 112 emitted from the LGCO 100. If the optic were linear then the effect of these alterations on the reflectors 138 would be to aim the beam 112 down or up without increasing divergence.

A circular reflector in the collimating stage can be used to approximate the parabolic reflector and can produce substantially collimated light. They could also be potentially easier to build. It may also be the case for certain applications that increased divergence is desirable, and this can be achieved by chosing another shape for the reflector, such as, for example, a section of a circle.

FIG. 11 shows a LGCO 100 with smaller functional elements 186. The functional elements 186 are defined as: the reflectors 138, the interfaces 120, and the apertures 130 comprised of the exit faces 166 and the injection faces 168. The optics that have been shown in the preceding figures have used large functional elements 186 for explanatory purposes. In actuality, the functional elements 186 would likely be small, with a period 188 between 1 micron and 1 millimeter. Below 1 micron, optical interference would likely dominate the performance of the optic 100, and above 1 millimeter in size the necessary diamond tooling becomes prohibitively expensive. However, larger sizes are possible and functional, and smaller sizes would also function at wavelengths below those of visible light.

The subsequent sections outline specific embodiments of the technology.

Figure 12A:
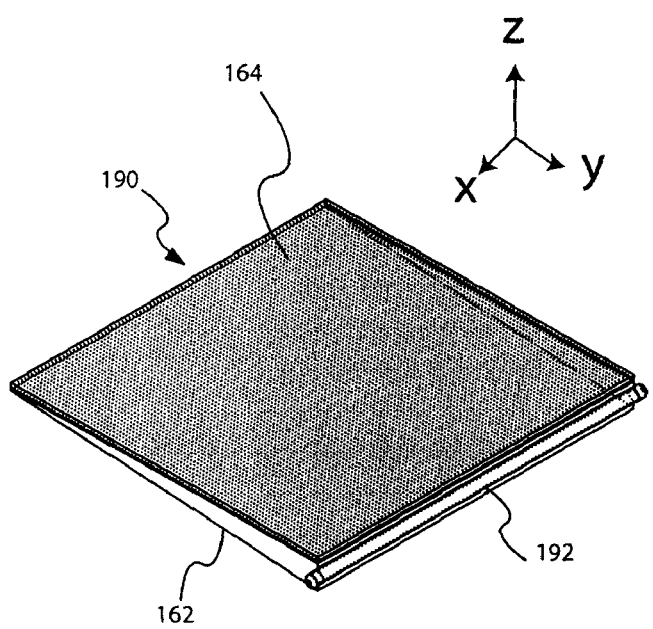
FIG. 12A shows a perspective view of the linear geometry embodiment of the light-guide collimating optic of the present invention where the slab design of FIG. 6 and a tube-shaped light source are implemented.
Figure 12B:
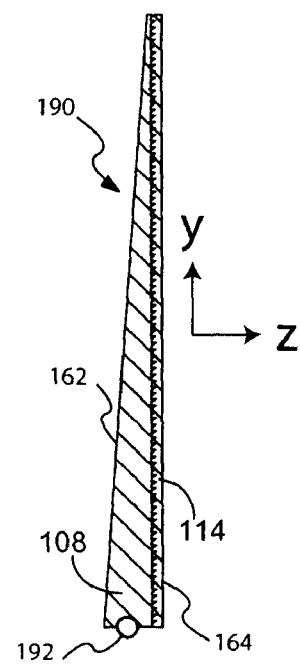
FIG. 12B shows a cross-sectional view of the embodiment of FIG. 12A.

FIGS. 12A and 12B show a linear LGCO 190 made using a two-part slab composition with one slab 162 for the waveguide stage 108 and another slab 164 for the collimating stage 114. A tube shaped bulb 192, in this case a fluorescent bulb, runs down one edge of the optic. The light emerging from the linear LGCO 190 will be collimated in the plane YZ and divergent in the plane XZ. This embodiment has applications in computer displays and lighting.

Figure 13A:
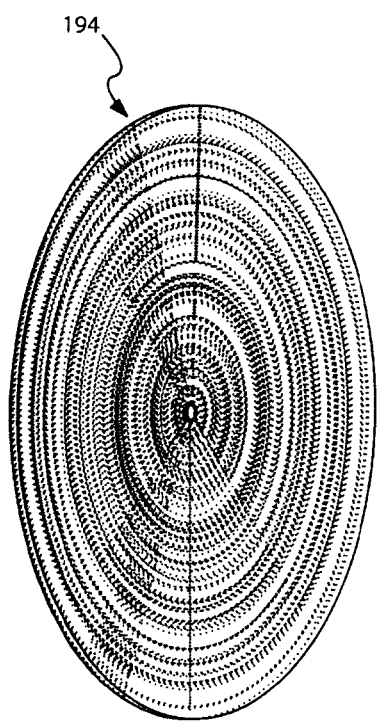
FIG. 13A shows a perspective view of the revolved geometry embodiment of the light-guide collimating optic of the present invention where the slab design of FIG. 6 and the small functional elements of FIG. 11 are implemented.
Figure 13B:
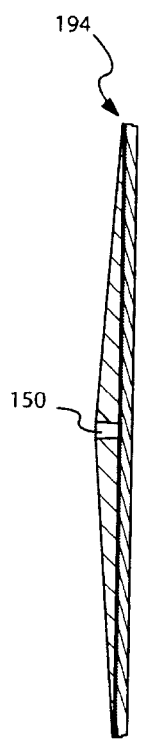
FIG. 13B shows a complete cross-sectional view of the embodiment of FIG. 13A.
Figure 13C:
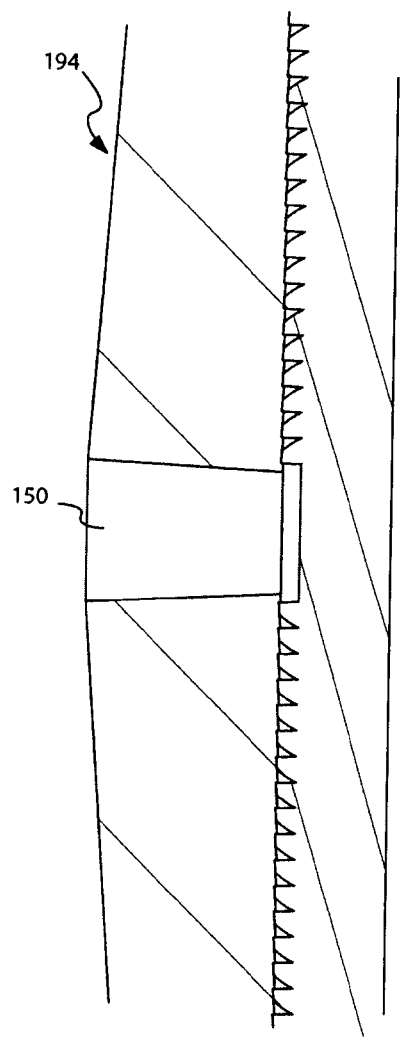
FIG. 13C shows an enlarged cross-sectional view of the embodiment of FIG. 13A.

FIGS. 13A-13C show a revolved LGCO 194. This optic will produce a beam like the one from FIG. 7. The diameter of this LGCO 194 is 20 centimeters and the LGCO 194 is approximately 1 centimeter thick at its widest point. The hub 150 has room for an LED bulb 5 mm in diameter and 7 mm tall, other bulb sizes can be accommodated by altering the design.

Figure 14A:
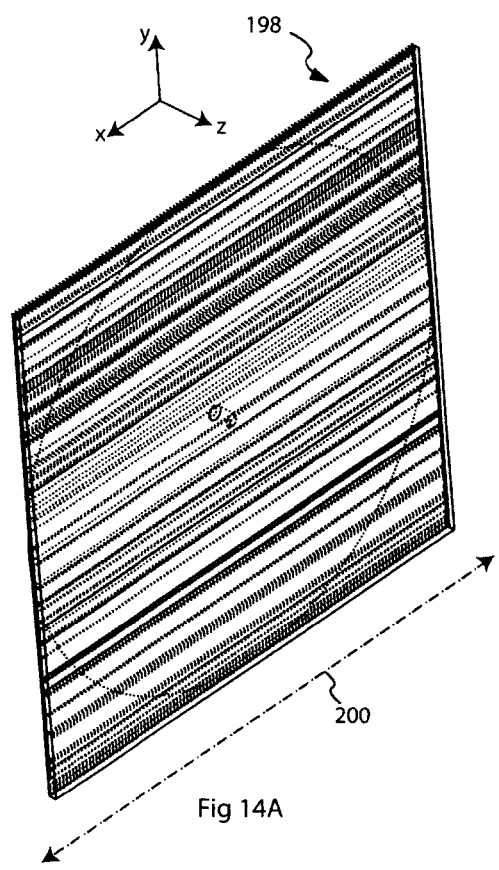
FIG. 14A shows a perspective view of the broad beam embodiment of the light-guide collimating optic of the present invention where a linear geometry describes the functional elements, a revolved geometry describes the waveguide stage, and the slab design of FIG. 6 is implemented.
Figure 14B:
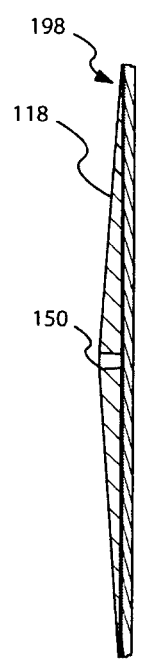
FIG. 14B shows a complete cross-sectional view of the embodiment of FIG. 14A.
Figure 14C:
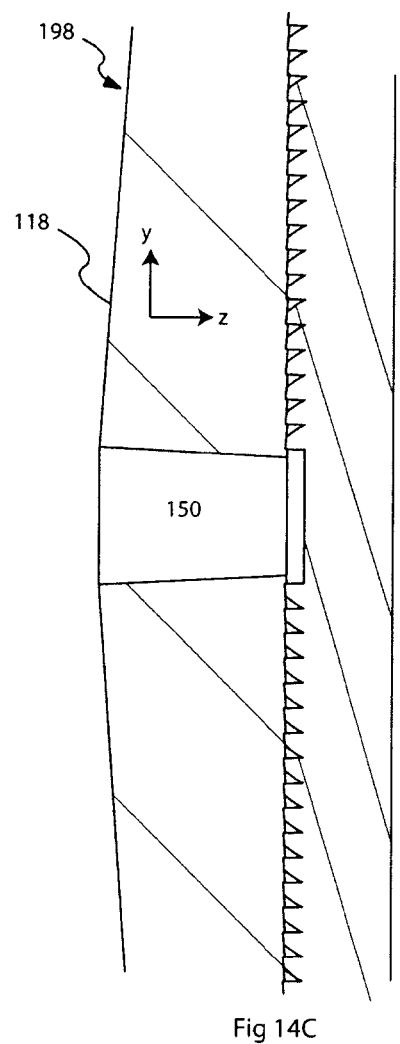
FIG. 14C shows an enlarged cross-sectional view of the of the embodiment of FIG. 14A.
Figure 15A:
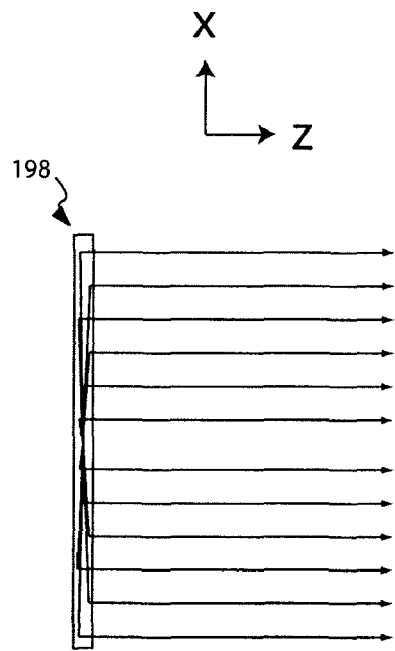
FIG. 15A shows a computer simulation of the embodiment of FIG. 14 in the XZ plane.
Figure 15B:
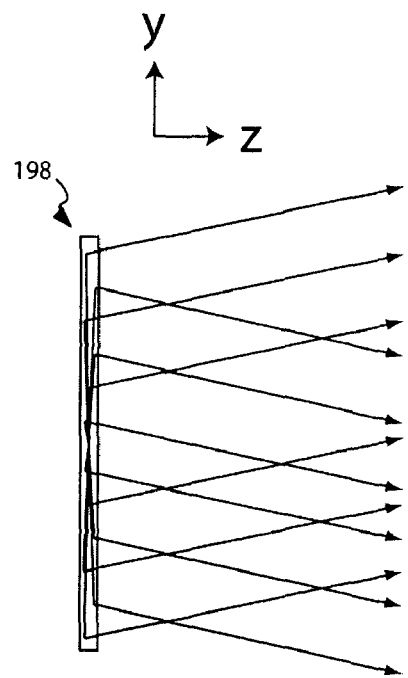
FIG. 15B shows a computer simulation of the embodiment of FIG. 14 in the YZ plane.
Figure 15C:
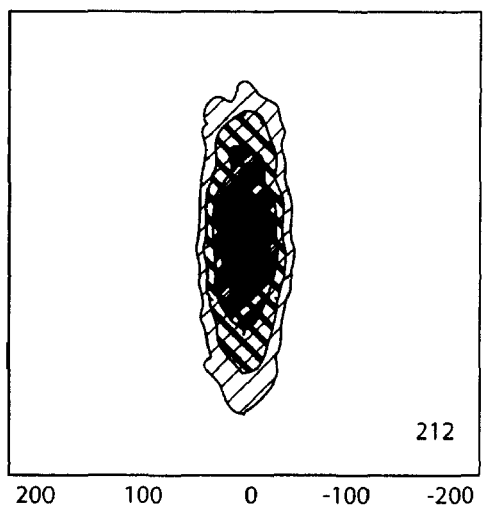
FIG. 15C shows the intensity relief plot from a computer simulation of the embodiment of FIG. 14.
Figure 15D:
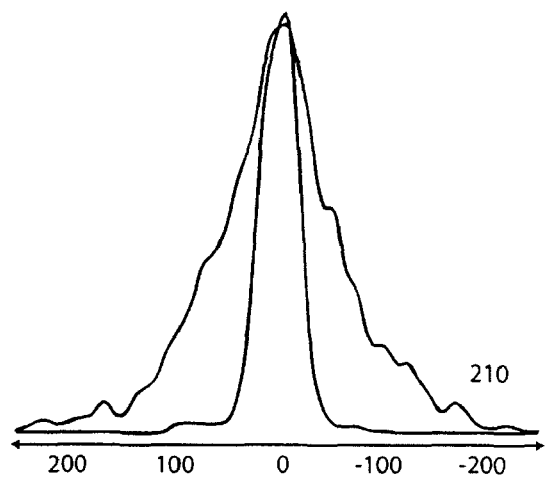
FIG. 15D shows the intensity profile from a computer simulation of FIG. 14.

FIG. 14A-14C shows a hybrid linear/revolved optic 198, defined here as a broadbeam optic. The functional elements 186 from FIG. 11 describe the cross section of the linear optic along a longitudinal axis 200. The backside face 118 of the waveguide stage 108 is revolved and a hub 150 for a bulb is in the center of the LGCO 198. This LGCO 198 is not as efficient as the previous optic 194 in that more light is lost due to internal scattering. The LGCO 198 collimates light in the plane YZ while letting the light fan out in the plane XZ. This would be useful for automotive headlamps where one would want to illuminate a wide-swath of road but where illumination above the road is not essential. The LGCO 198 produces a similar beam as the LGCO 190 from FIGS. 12A-12C, except that it accepts a small point source bulb and does not require a long tubular bulb.

Profiles 210 and a relief plot 212 of this broadbeam LGCO 198 are shown in FIGS. 15A-15D.

Figure 16A:
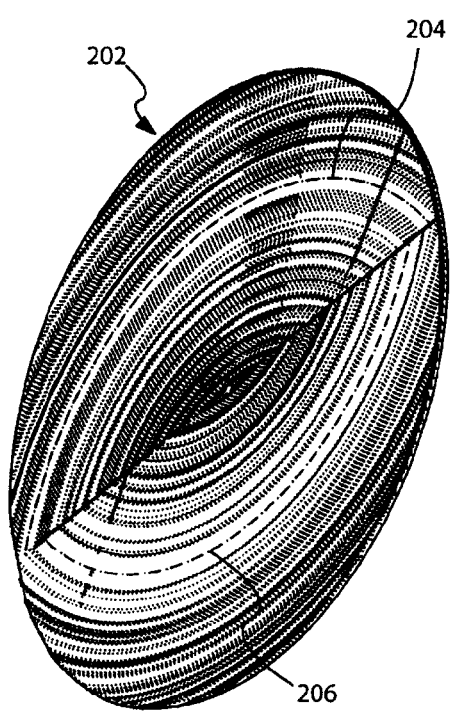
FIG. 16A shows a perspective view of the semi-broad beam embodiment of the light-guide collimating optic of the present invention where the circular arcs describing the duality of revolved optics are not concentric with the circumference of the light-guide collimating optic and the slab design of FIG. 6 is implemented.
Figure 16B:
FIG. 16B shows a complete cross-sectional view of the embodiment of FIG. 16A.
Figure 16C:
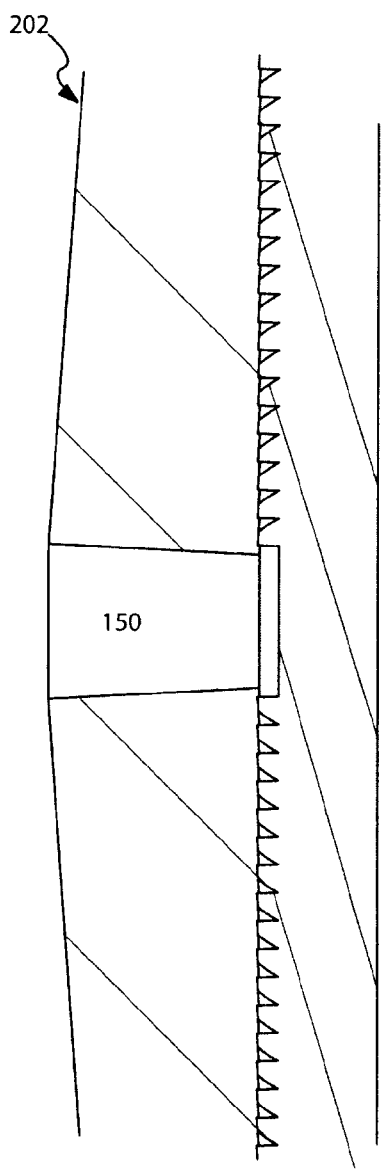
FIG. 16C shows an enlarged cross-sectional view of the embodiment of FIG. 16A.

There are a number of ways to achieve a broadbeam light shape. Shown in FIGS. 16A-16C is another LGCO 202, called a semi-broadbeam optic. The functional elements 186 are prescribed on circular arcs 204 and 206. The circular arcs are not concentric with the circumference 208 of the LGCO 202. In the embodiment shown in FIGS. 16A-16C, the centers of the circles that prescribe the arcs 204 and 206 are equidistant from the center of the LGCO 202 itself. The resultant beam from the LGCO 202 looks very similar too that shown in FIGS. 15A-15D, but it is optically more efficient than the embodiment 198 from FIG. 14.

Figure 17A:
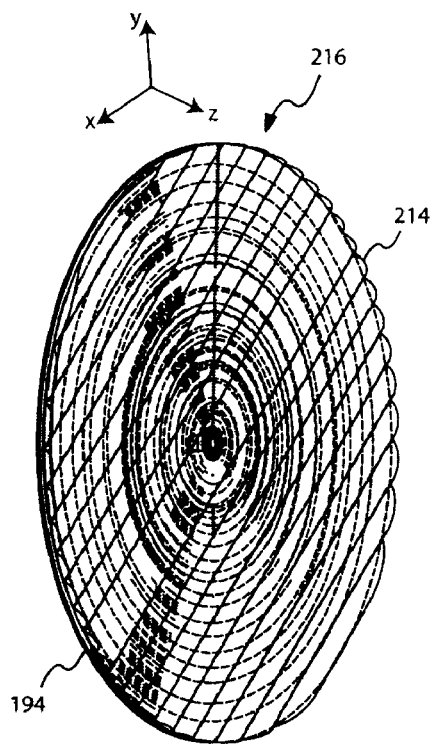
FIG. 17A shows a perspective view of the embodiment of FIG. 16 with cylindrical lenses on the emitter face.
Figure 17B:
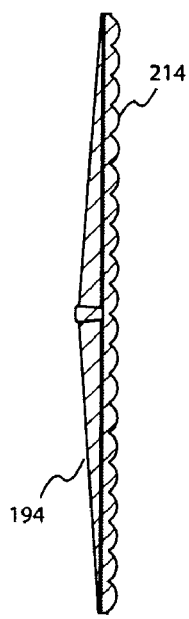
FIG. 17B shows a complete cross-sectional view of the embodiment of FIG. 17A.
Figure 17C:
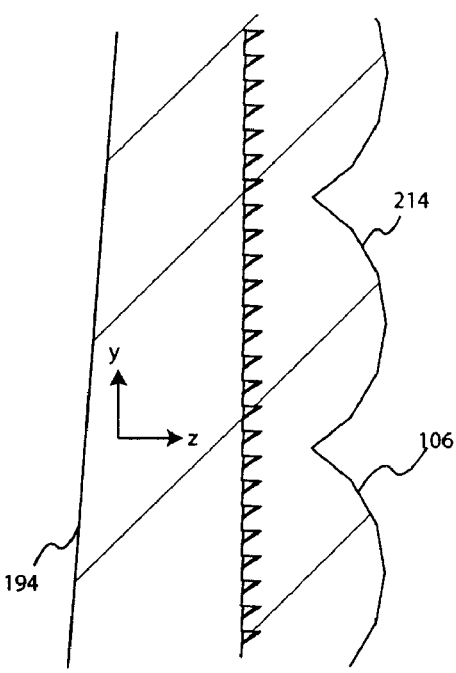
FIG. 17C shows an enlarged cross-sectional view of the embodiment of FIG. 17A.

FIG. 17 shows the revolved LGCO 194 with cylindrical lenses 214 on the emitter face 106. The resultant LGCO 216 also produces a broadbeam, which is divergent YZ plane and collimated in the XZ plane.

Although the light source (lamp or LED) has previously been shown in the center of the LGCO, it is possible to edge-mount the bulb as well. FIGS. 18A-18B show another embodiment of the optic where this is the case. The bulb 102 is positioned at the edge of the LOCO 218. The LGCO 218 is formed by taking a circular section of the LGCO 216 from FIG. 17A-17C. Such sectioning can be done to make any embodiment edge-lit; furthermore, the sectioning need not be circular but can be square, triangular, or any appropriate shape.

Figure 19:
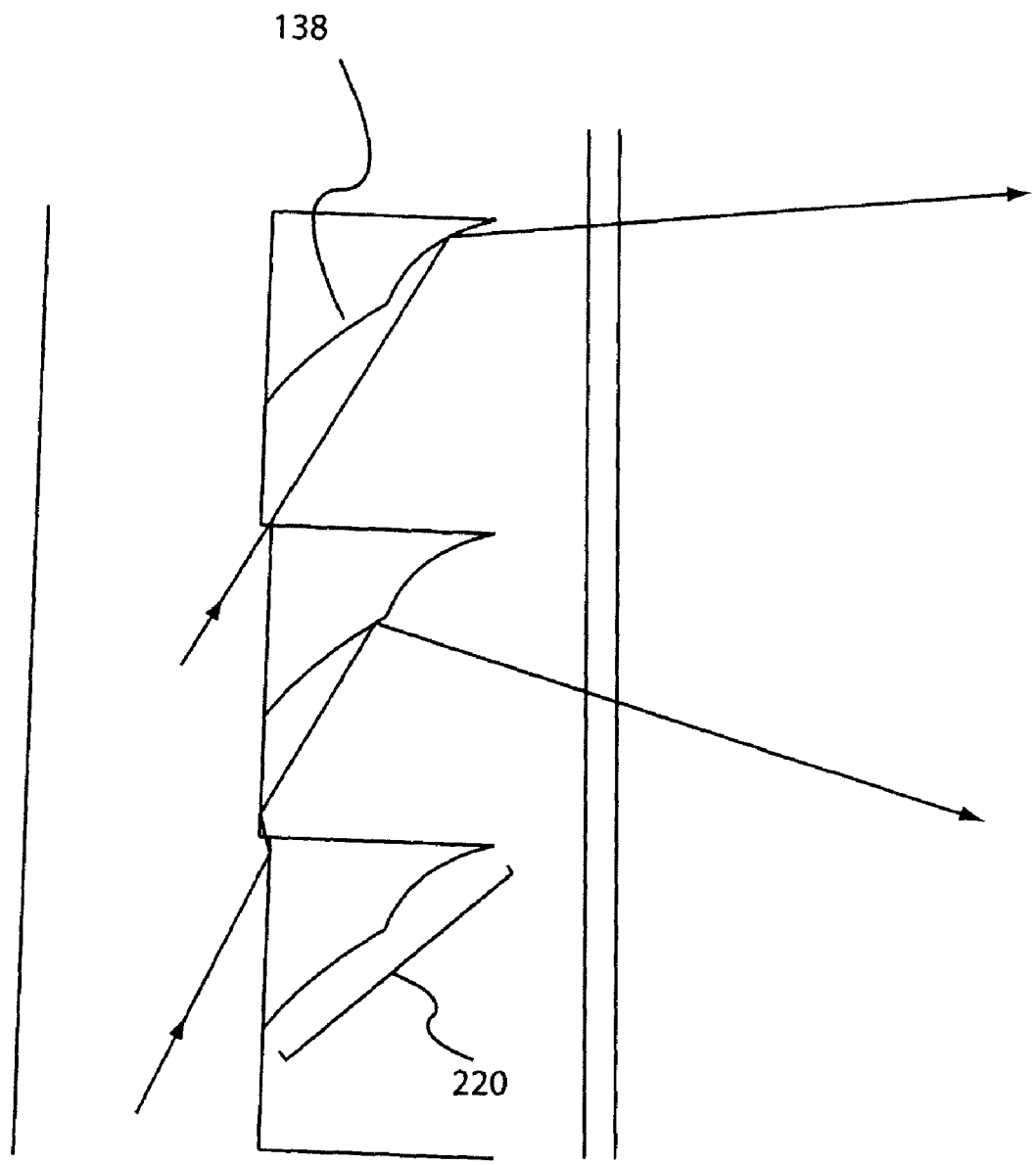
FIG. 19 shows an embodiment of the light-guide collimating optic of the present invention where compound reflectors are used in the collimating stage and the slab design of FIG. 6 is implemented.

It is possible to make the reflector 138 in the collimating stage 114 any other sort of reflector, including a compound reflector 220 as is shown in FIG. 19. This gives more light-shaping freedom.

Figure 20:
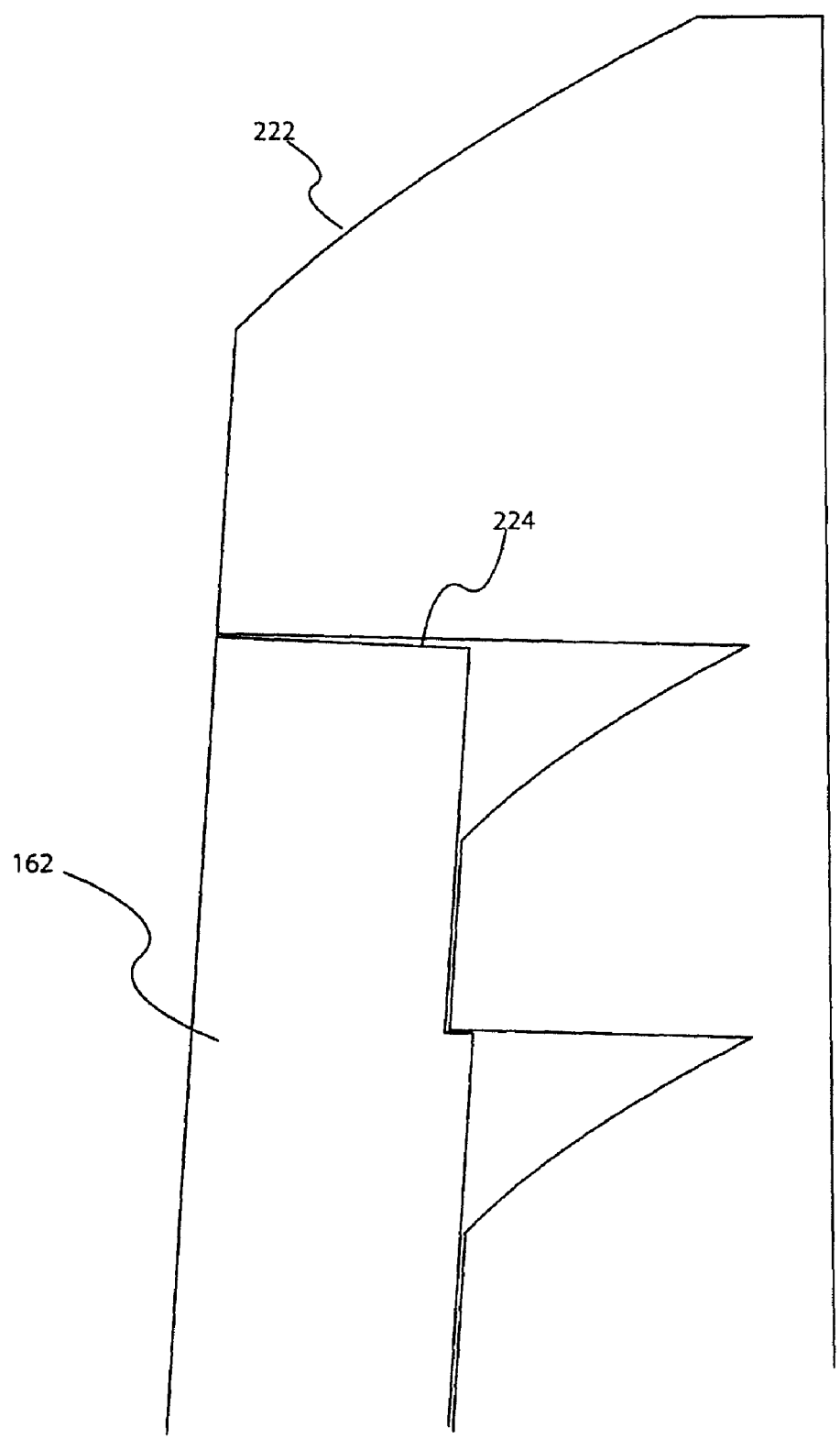
FIG. 20 shows an embodiment of the light-guide collimating optic of the present invention where the collimating stage containing a large reflector overlaps the waveguide stage and the slab design of FIG. 6 is implemented.

The waveguide stage slab 162 is shown in preceding figures as tapering to a very fine edge. For structural and fabrication reasons, the waveguide stage slab 162 may require a minimum thickness. FIG. 20 shows a wider and larger reflector 222 that can overlap the outside edge 224 of the waveguide stage slab 162.

Figure 21:
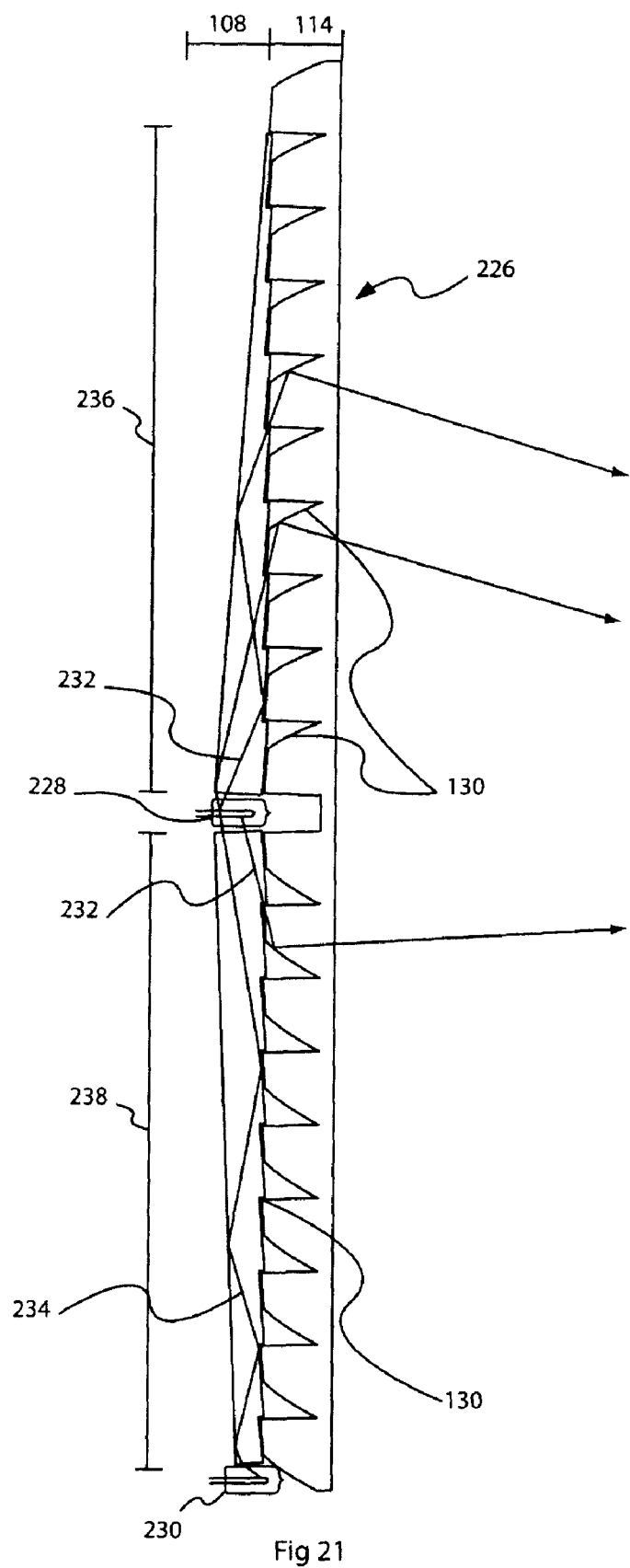
FIG. 21 shows an embodiment of the light-guide collimating optic of the present invention where high beam and low beam functionality and angular reflectors of FIG. 9 in the collimating stage are incorporated.

FIG. 21 shows a sectional design for a highbeam/lowbeam LGCO 226. The LOCO 226 accepts light from a central bulb 228 and an edge-mounted bulb 230. The reflectors 138 in the top half 236 of the optic 226 are modeled after FIG. 9; they will collimate light into a downwards pointing beam. The reflectors 138 on the bottom half 238 of the LGCO 226 will collimate light horizontally.

When the central bulb 228 emits light 232 this light travels in both directions within the waveguide stage 108. This light couples to reflectors 138 in both the top half 236 and the bottom half 238 of the LGCO 226. The light 232 emitted from the LGCO 226 is comprised of rays aimed downwards coming from the top half 236 and rays traveling horizontally coming from the bottom half 238.

When the edge-mounted bulb 230 emits light 234 this light enters the waveguide stage 108 at the bottom edge 240 and travels in the waveguide stage 108 going upwards only. Light 234 will bypass all the apertures 130 and remain in the waveguide stage 108 through the bottom half 238 of the LGCO 226. This is because the apertures 130 allow light to exit the waveguide stage 108 only when that light is traveling in the direction in which the waveguide stage 108 is tapering. When light travels the opposite direction in the waveguide stage 108, it cannot exit at the apertures 130 and continues to propagate. In the case of the LGCO 226, the light 234 from the edge-mounted bulb 230 will propagate through the bottom half 238 and into the top half 236 of the waveguide stage 108. The light 234 will then be traveling in the correct sense so as to pass through the apertures 130 and reflect off the reflectors 138. Because the reflectors 138 in the top half 236 of the optic 226 are oriented so as to aim light downwards, the resulting beam 234 will be directed downwards. Thus, the LGCO 226 creates a low-beam when only the edge-mounted bulb 230 is lit and a high-beam when the central bulb 228 is lit.

Figure 22:
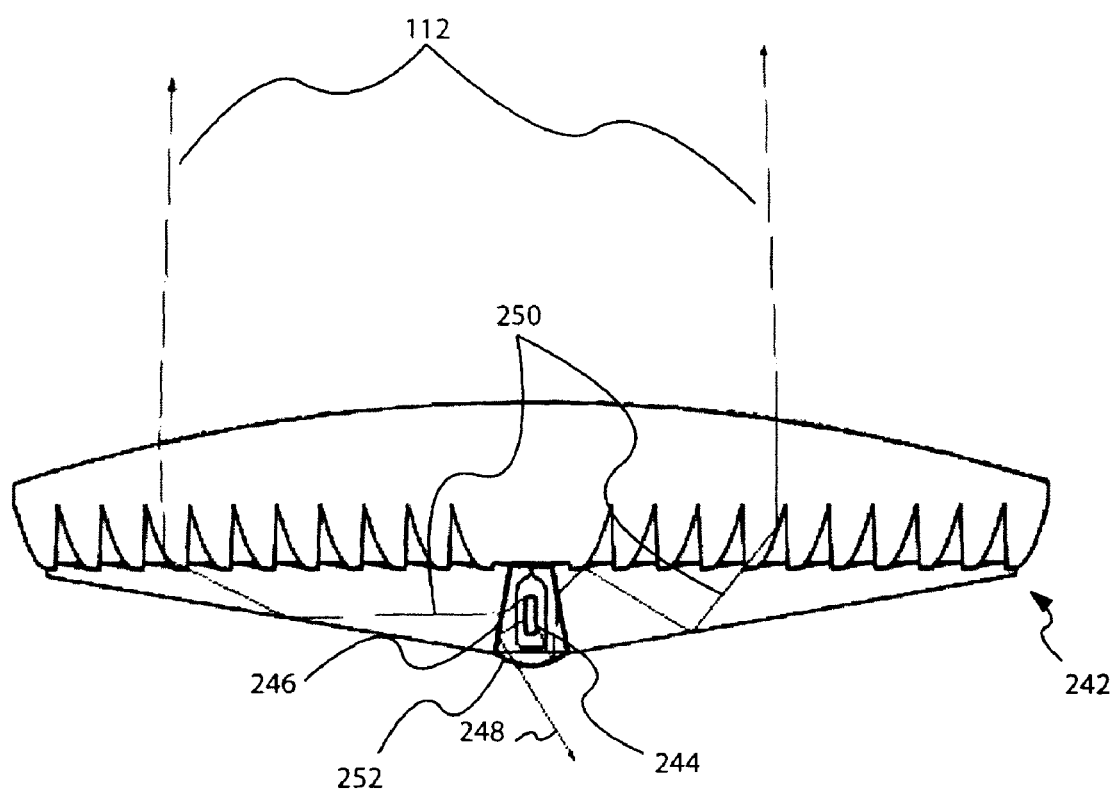
FIG. 22 shows an embodiment of the light-guide collimating optic of the present invention where dichroic mirrors encase the isotropic light source.

The bulb portion of these designs has not been discussed in detail, because any bulb can be implemented. FIG. 22 shows an exemplary embodiment of such a LGCO 242 using a high-heat bulb 244. This figure shows other innovations specific to such a light source. A dichroic mirror 246 which reflects infrared radiation 248 is used to separate the lamp 244 from the LGCO 242. This reflects infrared radiation 248 back towards the lamp 244 while allowing visible light 250 to enter into the LGCO 242 and to be shaped into a forward collimated beam 112. A second dichroic mirror 252 that reflects visible 250 light can be placed underneath the light source 244 to allow infrared radiation 248 to escape out of the light-bulb housing 254 while trapping visible light 250 inside so that it can couple into the LGCO 242.

Other light-trapping schemes can also be employed to maximize coupling between the light source and the LGCO. The most common such scheme will be to put mirrored faces on the bulb or LED itself in order to avoid light escaping in an undesired orientation.

In addition to lamps and bulbs, light can be coupled into any of the above light-guide collimating optics via a fiber optic.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

The invention claimed is:

1. An illumination device based on multiple total internal reflections, comprising:
   a light-projecting slab having a plurality of injection faces and an output surface, the light-projecting slab further including a plurality of optical elements located optically between the plurality of injection faces and the output surface, each optical element being separated from adjacent elements by a material having an index of refraction lower than that of a material of the light-projecting slab, wherein each optical element includes a curved reflection surface, in cross-section the curve of the reflection surface being at least substantially parabolic and having an axis of symmetry and a focal point lying at least substantially along the axis of symmetry;
   an injection molded wedge-shaped optical waveguide slab separate from and optically coupled to the light-projecting slab, the optical waveguide slab having a first surface that is a reflector operating by total internal reflection in conjunction with a plurality of reflectors opposed to the first surface, the optical waveguide slab further including a plurality of exit faces adjacent the injection faces of the light-projecting slab, the plurality of injection faces and the plurality of exit faces forming a plurality of optical input apertures located between the optical waveguide slab and the light-projecting slab, the optical waveguide slab further including an input surface to receive light from a light source, the waveguide slab guiding the light from the input surface towards the optical input apertures through multiple total internal reflections,
   the optical elements of the light-projecting slab directing the light from each input aperture to the output surface wherefrom the light exits the illumination device as a plurality of beams, each beam having been reflected off the reflection surface of one of the optical elements via total internal reflection, in cross-section the curves of the reflection surfaces of the optical elements each having a shape such that light passing generally through that curve's focal point and reflecting off the reflection surface which forms that curve has an output direction generally parallel to the axis of symmetry of that curve of that reflection surface; and
   the light source being optically coupled to the input surface of the optical waveguide slab.

2. The device as claimed in claim 1 wherein the plurality of reflectors of the waveguide slab are substantially parallel to the first surface of the waveguide slab.

3. The device as claimed in claim 1 wherein adjacent reflectors of the waveguide slab have one of the exit faces located therebetween.

4. The device as claimed in claim 1 wherein the input surface of the waveguide slab has a light input area and the output surface of the light-projecting slab has a light emitting area, the light input area being smaller than the light emitting area.

5. The device as claimed in claim 1 wherein the optical elements are located along substantially parallel lines.

6. The device as claimed in claim 1 wherein:
   the optical elements are annular and are located along substantially concentric circle arcs; and
   the input surface is shaped as a circle arc substantially concentric with the optical elements.

7. The device as claimed in claim 1 wherein the light exits the light-projecting slab as a substantially collimated beam.

8. The device as claimed in claim 1 wherein the output surface of the light-projecting slab is continuous after the plurality of optical elements.

9. The device as claimed in claim 7 wherein the light source is a first light source and the substantially collimated beam of light is a first substantially collimated beam of light, the device further comprising a second light source optically coupled to the waveguide to generate a second beam of light exiting the light-projecting slab as a second substantially collimated beam of light, the second substantially collimated beam of light exiting the light projecting slab at a different angle relative to the first substantially collimated beam of light.

10. The device as claimed in claim 1, wherein, in cross-section, the curve of each reflection surface is parabolic.

11. The device as claimed in claim 10 wherein, in cross-section, the focal point of the curve of each reflection surface lies directly on the axis of symmetry of that curve.

12. The device as claimed in claim 11 wherein, in cross-section, the focal point of the curve of each reflection surface lies directly on the axis of symmetry of that curve.

13. The device as claimed in claim 1 wherein each of the optical input apertures is sized and positioned such that, in cross-section, substantially all of the light passing through that optical input aperture passes through the focal point of the curve of the reflection surface associated with that optical input aperture.

14. The device as claimed in claim 1 wherein each of the optical input apertures is sized and positioned such that, in cross-section less than substantially all of the light passing through that optical input aperture passes through the focal point of the curve of the reflection surface associated with that optical input aperture.

15. The device as claimed in claim 1 wherein, in cross-section all of the curves of the reflection surfaces are identical.

16. The device as claimed in claim 1 wherein
the curved reflection surface of each of the optical elements of the light-projecting slab is a single uncoated curved reflection surface,
the light projection slab is injection-molded, and
the optical waveguide slab is injection-molded.

17. The device as claimed in claim 1 wherein the light source is a light emitting diode.

18. The device as claimed in claim 1 wherein the optical elements are annular and are located along substantially concentric circles; and the input surface is shaped as a circle substantially concentric with the optical elements.

19. The device as claimed in claim 6 wherein the light-projection slab has a circular circumference, and the concentric circle arcs along which the optical elements are located are eccentric with the circular circumference of the light-projection slab.

20. The device as claimed in claim 1, wherein the output surface of the light-projection slab includes a plurality of lenses to cause the beams to exiting the output surface to diverge in at least one plane.

* * * * *

UNITED STATES PATENT AND TRADEMARK OFFICE
CERTIFICATE OF CORRECTION

Page 1 of 1

PATENT NO. : 8,152,339 B2
APPLICATION NO. : 12/597648
DATED : April 10, 2012
INVENTOR(S) : John Paul Morgan It is certified that error appears in the above-identified patent and that said Letters Patent is hereby corrected as shown below:

On the Title page the portion reading:

"Related U.S. Application Data"
(60) Provisional application No. 60/915,207, filed on May 1, 2007, provisional application No. 60/942,745, filed on Jun. 8, 2007, provisional application No. 60/951,775, filed on Jul. 25, 2007.

should not appear on the patent cover.

Signed and Sealed this
Ninth Day of April, 2013

Teresa Stanek Rea
*Acting Director of the United States Patent and Trademark Office*